US009905647B2

United States Patent
Fay et al.

(10) Patent No.: US 9,905,647 B2
(45) Date of Patent: *Feb. 27, 2018

(54) GROUP III-NITRIDE COMPOUND HETEROJUNCTION TUNNEL FIELD-EFFECT TRANSISTORS AND METHODS FOR MAKING THE SAME

(71) Applicant: University of Notre Dame du Lac, Notre Dame, IN (US)

(72) Inventors: Patrick Fay, Granger, IN (US); Wenjun Li, South Bend, IN (US); Debdeep Jena, Ithaca, NY (US)

(73) Assignee: University of Notre Dame du Lac, South Bend, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/925,542

(22) Filed: Oct. 28, 2015

(65) Prior Publication Data
US 2017/0125521 A1    May 4, 2017

(51) Int. Cl.
*H01L 29/78* (2006.01)
*H01L 29/20* (2006.01)
*H01L 29/08* (2006.01)

(52) U.S. Cl.
CPC ...... *H01L 29/0895* (2013.01); *H01L 29/2003* (2013.01); *H01L 29/78* (2013.01)

(58) Field of Classification Search
USPC .......... 257/20, 194, 135–136, 213–413, 900, 257/902–903; 438/303, 591, 618, 421, 438/584, 637, 783, 763
See application file for complete search history.

(56) References Cited

U.S. PATENT DOCUMENTS

| 8,796,733 B2 | 8/2014 | Seabaugh et al. | |
|---|---|---|---|
| 2010/0163845 A1* | 7/2010 | Goel | H01L 29/205 257/24 |
| 2013/0093497 A1* | 4/2013 | Lee | H01L 29/78609 327/420 |
| 2013/0112986 A1* | 5/2013 | Hsiung | H01L 29/66462 257/76 |
| 2014/0167058 A1* | 6/2014 | Laboutin | H01L 29/66462 257/76 |

OTHER PUBLICATIONS

Polarization-Engineered III-Nitride Heterojunction Tunnel Filed-Effect Transistors, Wenjun et al, Apr. 24, 2015, vol. 1, 2015, pp. 29-34.*

* cited by examiner

Primary Examiner — Moin Rahman
(74) Attorney, Agent, or Firm — Greenberg Traurig, LLP

(57) ABSTRACT

A tunnel field-effect transistor device includes a p-type GaN source layer, an n-type GaN drain layer, and an interlayer interfaced between the source-layer and the drain layer. In one example, the interlayer includes an Indium Nitride (InN) layer. In one example, the interlayer includes a graded Indium gallium nitride layer and an InN layer. In one example, the interlayer may include a graded Indium gallium nitride ($In_xGa_{1-x}N$) layer and an Indium gallium nitride (InGaN) layer. In one example, the tunnel field-effect transistor device includes an in-line configuration. In one example, the tunnel field-effect transistor device includes a side-wall configuration.

8 Claims, 19 Drawing Sheets

GROUP III-NITRIDE COMPOUND HETEROJUNCTION TUNNEL FIELD-EFFECT TRANSISTORS AND METHODS FOR MAKING THE SAME

GOVERNMENT SUPPORT

This invention was made with government support under Agreement No. HR0011-13-3-0002 awarded by DARPA. The government has certain rights in the invention.

TECHNICAL FIELD

This disclosure relates to tunneling field-effect transistors (TFETs) and more particularly to TFET devices utilizing group III-nitride compound heterojunctions and methods of making the same.

BACKGROUND

Tunnel field-effect transistors (TFETs) have been considered as a candidate to replace metal-oxide-semiconductor field-effect transistors (MOSFETs) in low-voltage, energy-efficient and ultra-scaled integrated circuits. By using quantum-mechanical tunneling instead of thermionic emission, TFETs have the potential to achieve switching slopes (SS) less than 60 mV/decade. In some applications, to compete favorably with MOSFETs, TFETs may be required to achieve an on-current ($I_{ON}$) approaching 1 mA/μm, a ratio of on-current to off-current ($I_{OFF}$) greater than $10^5$, and switching slopes less than 60 mV/decade. TFET devices using Indium arsenide (InAs) and Gallium antimonide (GaSb) as semiconductor materials have been demonstrated experimentally. InAs and GaSb exhibit narrow band gaps. Although these experimental devices have been shown to achieve a high $I_{ON}$, these experimental devices also show a large $I_{OFF}$ and as such, do not achieve an acceptable $I_{ON}/I_{OFF}$ ratio. Further, these experimental devices exhibit significant ambipolar conduction, due to the narrow band gaps, complicating circuit design with these devices. Thus, current TFETs, including those based on group III-V compounds exhibiting narrow band gaps, are less than ideal.

SUMMARY

In general, this disclosure describes various techniques for developing TFETs including group III-nitride compound heterojunctions. In particular, this disclosure describes techniques for developing TFETs based on group III-nitride compound heterojunctions through the use of polarization engineering. In one example, through polarization engineering of the heterostructure, a polarization-induced charge can be used to generate large internal electric fields. At sufficiently high electric fields, interband tunneling can become significant even in large band gap materials. In one example, polarization-assisted p-type doping is used in a source region to mitigate the effect of the deep Magnesium (Mg) acceptor level in p-type Gallium nitride (GaN). Example simulations indicate that TFETs based on III-nitride heterojunctions according to the techniques described herein can be expected to achieve $I_{ON}/I_{OFF}$ ratios of $10^6$ or more, with switching slopes well below 60 mV/decade. Furthermore, simulations suggest that on-current densities approaching 200 μA/μm, and energy delay products approaching 26 aJ-ps/μm can be expected. Thus, the example TFET devices described herein may compete favorably with MOSFETs. The example devices described herein may be particularly useful for low-power or energy efficient digital processing applications, low-power RF and analog systems, wireless systems, sensing systems, and many other non-digital applications. Further, as described in detail below, the wide bandgap of the example devices may also be useful for applications operating in hostile environments (e.g., high temperature environments, environments where exposure to harsh chemicals is possible, etc.).

In one example, a tunnel field-effect transistor comprises a source-layer including p-type GaN, a drain-layer including n-type GaN, and an interlayer interfaced between the source-layer and the drain layer, wherein the interlayer includes an InN layer.

In one example, a tunnel field-effect transistor comprises a source-layer including p-type GaN, a drain-layer including n-type GaN, and an interlayer interfaced between the source-layer and the drain layer, wherein the interlayer includes an InN layer and a graded InGaN layer.

In one example, a tunnel field-effect transistor comprises a source-layer including p-type GaN, a drain-layer including n-type GaN, and an interlayer interfaced between the source-layer and the drain layer, wherein the interlayer includes an InGaN layer and a graded InGaN layer.

In one example, a tunnel field-effect transistor comprises a source-layer including p-type GaN, a drain-layer including n-type GaN, and an interlayer interfaced between the source-layer and the drain layer, wherein the interlayer includes an InGaN layer.

The details of one or more examples are set forth in the accompanying drawings and the description below. Other features, objects, and advantages will be apparent from the description and drawings, and from the claims.

DETAILED DESCRIPTION

Experimental tunnel field-effect transistors (TFETs) are currently being developed. Typical approaches for developing TFETs have focused on using Silicon (Si), Silicon-germanium (SiGe), and group III-V compounds as semiconductor materials. Experimental TFET devices using group III-V compounds exhibiting narrow band gaps have been demonstrated. As used herein the term narrow band gap may refer to a band gap less than the band gap of Silicon, (e.g., less than 1.1 electron volt (eV) or less than 0.7 eV), or a band gap less than a wide band gap. As used herein, in one example, the term wide band gap may refer to a band gap greater than the band gap of Indium Nitride (InN) (i.e., 0.7 eV) or a band gap greater than 3.0 eV. Experimental TFET devices using group III-V compounds exhibiting narrow band gaps exhibit a large $I_{OFF}$. In order to lower $I_{OFF}$, a TFET device may use group III-V compounds exhibiting wide band gaps as semiconductor materials as a substitute for group III-V compounds exhibiting narrow band gaps. Candidate group III-V compounds exhibiting wide band gaps include group III-nitrides, such as, for example, Gallium nitride (GaN) and Aluminum nitride (AlN). However, for devices utilizing group III-nitrides compounds, the large band gap may make it impractical to realize interband tunneling in group III-nitride homojunctions.

Figure 1:
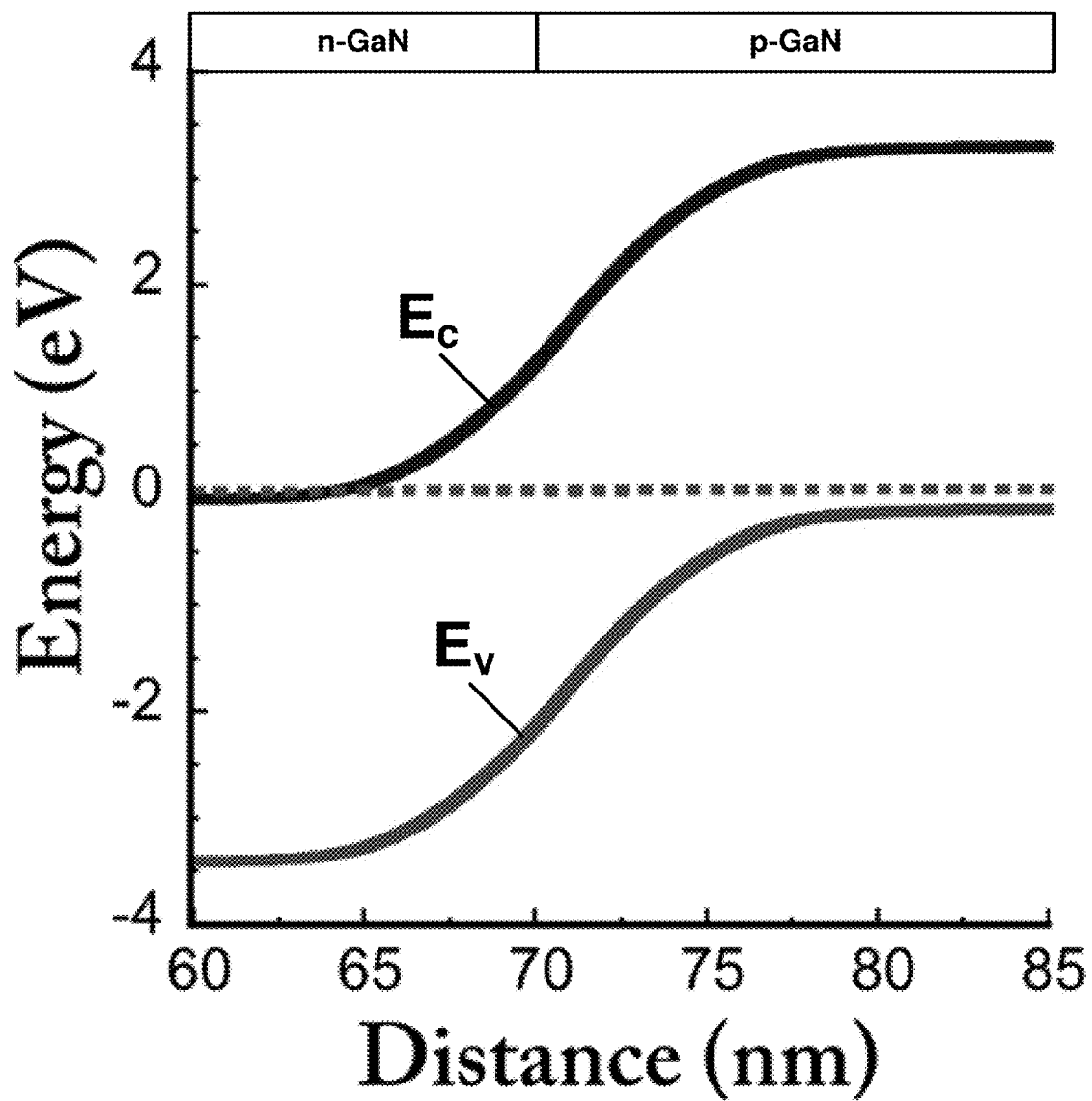
FIG. 1 is a band diagram for an example semiconductor device including a GaN homojunction.

FIG. 1 illustrates a band diagram for a semiconductor device including a GaN homojunction. In the example illustrated in FIG. 1, the semiconductor device includes impurity doping concentrations on both p-type and n-type sides of a GaN homojunction of $3\times10^{19}$ cm$^{-3}$. That is, in the example illustrated in FIG. 1, the acceptor doping concentration ($N_A$) of the p-type GaN source equals $3\times10^{19}$ cm$^{-3}$ and the donor doping concentration ($N_D$) of the n-type GaN drain equals $3\times10^{19}$ cm$^{-3}$. As illustrated in FIG. 1, even with these relatively high impurity doping concentrations, the large band gap of GaN results in a tunneling barrier of 3.4 eV and a tunneling distance of approximately 15 nm (nanometers).

D. Jena, J. Simon, A. Wang, et al., "Polarization-engineering in group III-nitride heterostructures: New opportunities for device design," Phys. Status Solidi (a), vol. 208, no. 7, pp. 1511-1516, June 2011 ("Jena") describes how interband tunneling can be achieved in III-nitride heterojunctions through polarization engineering. Due to the lack of inversion symmetry in wurtzite crystals such as GaN, a polarization dipole may be present along the c-axis. At heterointerfaces between materials with different internal polarizations, the discontinuity in internal polarizations may result in uncompensated sheet charge at the interface. In addition, the piezoelectric nature of these materials, combined with lattice mismatch, may introduce an additional contribution to the polarization discontinuity. Through engineering of the heterostructure, the polarization-induced charge can be used to generate large internal electric fields. Thus, at sufficiently high fields, interband tunneling can become significant even in large band gap materials. These effects have been experimentally demonstrated for GaN/AlN/GaN junctions in J. Simon, Z. Zhang, K. Goodman, et al., "Polarization-induced zener tunnel junctions in wide-band-gap heterostructures," Phys. Rev. Lett., vol. 103, no. 2, pp. 026801, July 2009, ("Simon") and GaN/Indium gallium nitride (InGaN)/GaN junctions in S. Krishnamoorthy, D. N. Nath, F. Akyol, et al., "Polarization-engineered GaN/InGaN/GaN tunnel diodes," Appl. Phys. Lett., vol. 97, no. 20, pp. 203502, 2010 ("Krishnamoorthy"). Krishnamoorthy describes experimental tunnel diodes based on GaN/In$_{0.33}$GaN/GaN junctions.

It should be noted that although GaN/AlN/GaN and GaN/InGaN/GaN junctions may enable interband tunneling for diode devices, transistors are sufficiently more complex than diodes. That is, the results of experimental diode devices may not be able to be reliably applied to develop transistor devices. In the cases of the respective diodes based on a GaN/AlN/GaN junction in Simon and a GaN/InGaN/GaN junction in Krishnamoorthy, these devices are limited with respect to the on-current density. That is, the example GaN/AlN/GaN junction in Simon and the GaN/InGaN/GaN junction in Krishnamoorthy do not suggest characteristics that could be implemented in a TFET device that could compete favorably with MOSFETs. Example simulations indicate that TFETs based on group III-nitride heterojunctions according to the techniques described herein can be expected to achieve $I_{ON}/I_{OFF}$ ratios of $10^6$ or more, with switching slopes well below 60 mV/decade, on-current densities approaching 200 µA/µm, and energy delay products approaching 26 aJ-ps/µm.

As described in further detail below, is some examples, the techniques described herein may be used to develop TFET devices having n-channel configurations. In some examples, the n-channel TFET configurations may include a p-GaN source layer, an interlayer, and an n-GaN drain layer. In some examples, the interlayer may include an Indium Nitride (InN) layer. As described in detail below, the thickness of an InN interlayer may be varied to adjust an effective band gap ($E_{geff}$). As used herein, an effective band gap may refer to the offset between the p-GaN valence band edge at the p-GaN/interlayer interface and the n-GaN conduction band edge at the n-GaN/interlayer interface. In some examples, the interlayer may include a graded Indium gallium nitride ($In_xGa_{1-x}N$) layer and an InN layer. In some examples, the interlayer may include a graded Indium gallium nitride ($In_xGa_{1-x}N$) layer and an InGaN layer. In these examples, in addition to, or as an alternative to, adjusting the thickness of an InN layer, the selection of the In mole fraction of the $In_xGa_{1-x}N$ may be used to adjust an effective band gap. It should be noted that although the example GaN/InN/GaN, GaN/$In_xGa_{1-x}$N/InN/GaN, and GaN/$In_xGa_{1-x}$N/InGaN/GaN heterojunctions described herein are described with respect to example device architectures, the example heterojunctions described herein may be utilized in other device architectures.

Figure 2A:
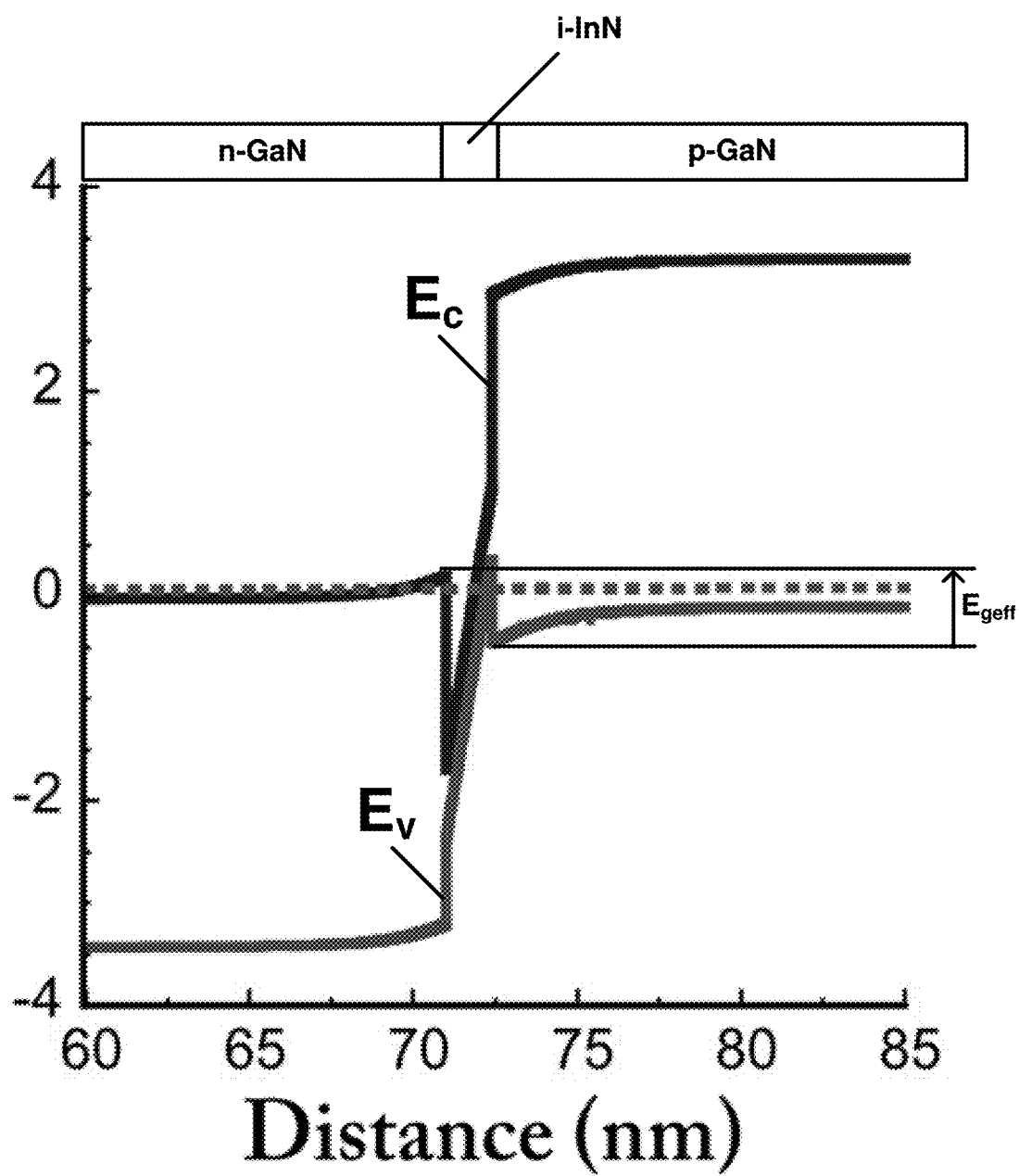
FIG. 2A is a band diagram for an example semiconductor device including a GaN/InN/GaN heterojunction with 1.4 nm InN layer thickness according to one or more techniques of this disclosure.
Figure 2B:
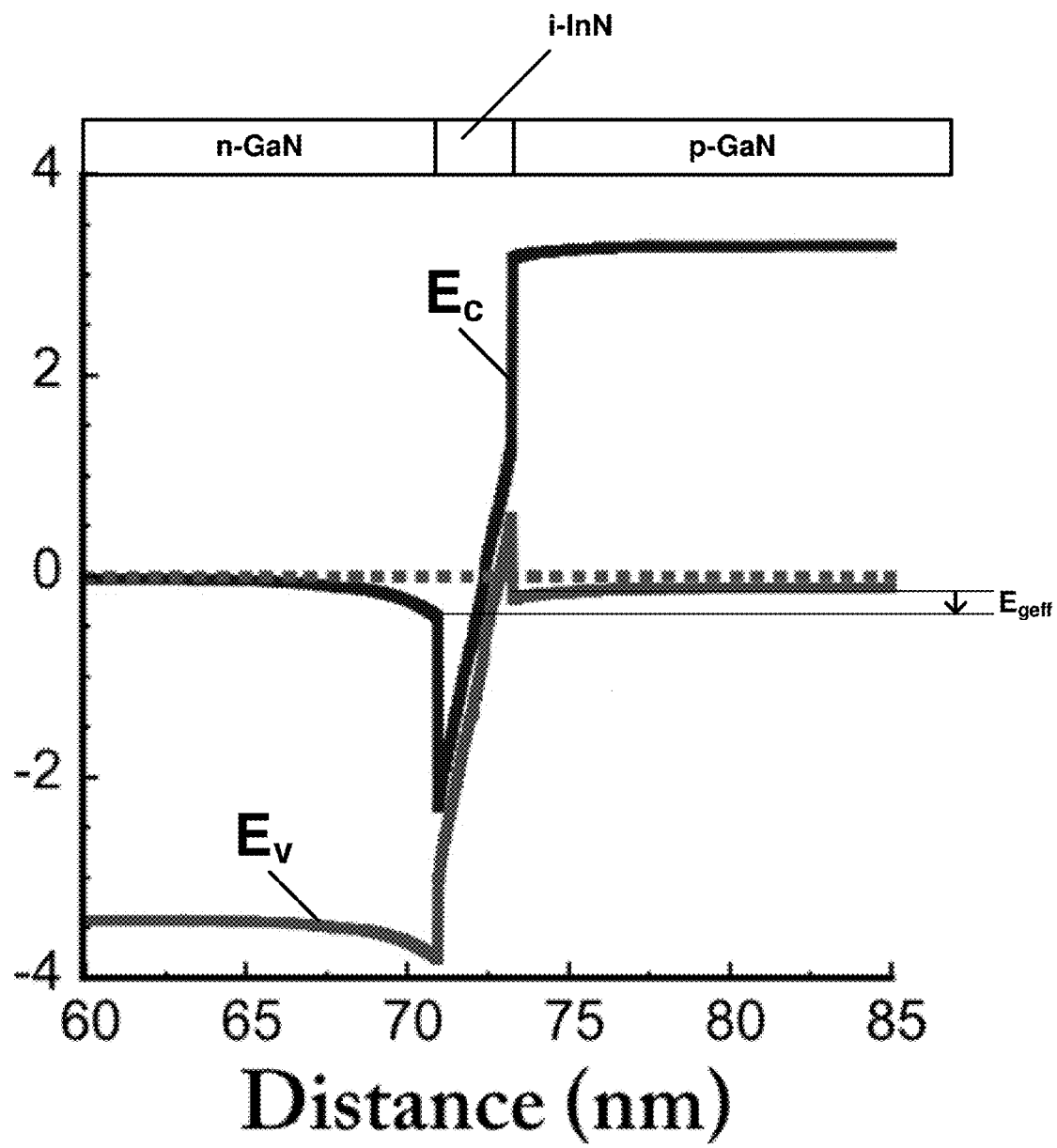
FIG. 2B is a band diagram for an example semiconductor device including a GaN/InN/GaN heterojunction with 2.4 nm InN layer thickness according to one or more techniques of this disclosure.

As described above with respect to FIG. 1, it may be impractical to realize interband tunneling for semiconductor devices having group III-nitride homojunctions. FIG. 2A is a band diagram for an example semiconductor device including a GaN/InN/GaN heterojunction with 1.4 nm InN layer thickness. FIG. 2B is a band diagram for an example semiconductor device including a GaN/InN/GaN heterojunction with 2.4 nm InN layer thickness. In the examples illustrated in FIG. 2A and FIG. 2B, for each of the heterojunctions, the offset between the p-GaN valence band (Ev) edge at the p-GaN/InN interface and the n-GaN conduction band (Ec) edge at the n-GaN/InN interface can be considered as an effective band gap $E_{geff}$. In the example illustrated in FIG. 2A, the energy band is a staggered-gap alignment and $E_{geff}$ is approximately 0.64 eV. In the example illustrated in FIG. 2B, when the thickness of the InN layer is increased to 2.4 nm, a broken-gap alignment occurs and $E_{geff}$ is approximately −0.37 eV. As described in further detail below, this property, i.e., that the thickness of the InN layer in a GaN/InN/GaN heterojunction may change band gap characteristics, may enable a diverse range of TFETs to be developed.

Figure 3:
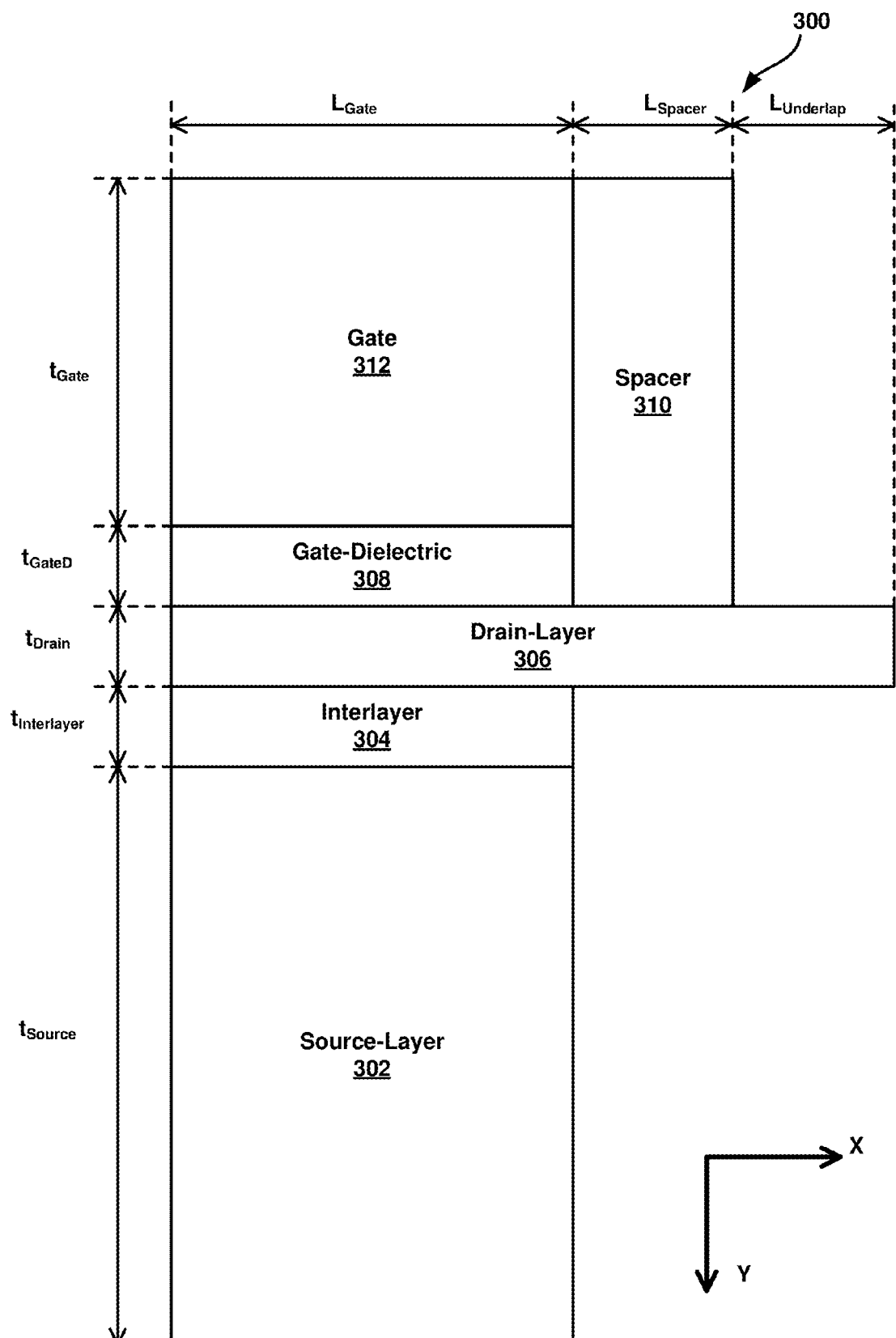
FIG. 3 is a conceptual drawing illustrating an example TFET semiconductor device according to one or more techniques of this disclosure.

FIG. 3 is a conceptual drawing illustrating an example TFET semiconductor device according to one or more techniques of this disclosure. Device 300 may be described as an in-line TFET in which the tunnel junction is parallel with the gate electrode. It should be noted that although TFET devices having in-line geometries have been explored theoretically and demonstrated experimentally, these TFET devices do not contemplate the use of the heterojunctions as described herein. FIG. 3 provides a cross-sectional view of device 300. It should be noted that in some implementations device 300 may be mirrored about the Y-axis. Further, it should be noted that representations of devices are not necessarily to scale and in some instances proportions may have been exaggerated in order to more clearly depict certain features. Further, it should be noted that device 300 may include one or more contacts (e.g., source contact, drain contact, etc.), which for the sake of brevity are not illustrated in FIG. 3.

As illustrated in FIG. 3, example device 300 includes source-layer 302, interlayer 304, drain-layer 306, gate-dielectric 308, spacer 310, and gate 312. Each of the layers of device 300 may be fabricated according to any combination of semiconductor fabrication techniques including semiconductor fabrication techniques selected from the group consisting of chemical vapor deposition (CVD), low pressure CVD (LPCVD), atmospheric pressure CVD (APCVD), ultrahigh vacuum CVD (UHVCVD, atomic layer deposition (ALD), molecular layer deposition (MLD), plasma enhanced CVD (PECVD), metal-organic CVD (MOCVD), molecular beam epitaxy (MBE), sputter deposition, ion implantation, annealing, wet chemical etching, gaseous chemical etching, plasma etching, reactive ion etching, masking lithography, optical lithography, electron-beam lithography, chemical mechanical polishing (CMP), evaporation, and physical vapor deposition. As described in detail below parameters of source-layer 302, interlayer 304, drain-layer 306, gate-dielectric 308, spacer 310, and gate 312 may be optimized based on one or more simulations.

Gate 312 may be configured conduct a voltage and may include of any type of electrically conductive material such as those selected from the group consisting of aluminum, cobalt, copper, gold, hafnium, nickel, palladium, platinum, molybdenum, niobium, polysilicon, rhodium, silver, tantalum, tantalum nitride, tin, titanium nitride, titanium tungsten, tungsten, vanadium, zirconium, an electrically conductive polymer, and mixtures thereof. In one example, gate 312 includes gold. As illustrated in FIG. 3, the thickness of gate 312 is indicated by $t_{Gate}$. In one example, $t_{Gate}$ may be 20 nm or within a nominal variation thereof. Further, $t_{Gate}$ may be varied proportionally (e.g., linearly, exponential, etc.) based on changes to dimension and/or parameters of other components of device 300. It should be noted that in the examples described below $L_{Gate}$ was selected to be 20 nm based on current manufacturing capabilities and dimensions and parameters of other components were selected based on the selection of $L_{Gate}$. In other examples, dimensions and parameters of other components could be selected based on different selected values of $L_{Gate}$.

Gate-dielectric 308 may be configured to insulate gate 312 from the bulk of device 300 and may include of any known dielectric material such as those selected from the group consisting of, aluminum nitride, aluminum oxide, barium fluoride, barium strontium titanium oxide, barium titanium oxide, calcium fluoride, cerium fluoride, cerium oxide, hafnium aluminate, hafnium oxide, hafnium oxynitride, hafnium silicon oxide, hafnium silicon oxynitride, indium oxide, lanthanum oxide, lanthanum aluminum oxide, lanthanum silicon oxides, lead scandium tantalum oxide, lead zinc niobate, magnesium fluoride, niobium fluoride, niobium oxide, silicon nitride, silicon oxide, strontium bismuth tantalite, strontium titanium oxide, zirconium oxide, zirconium silicon oxide, titanium oxide, titanium dioxide, tantalum dioxide, tantalum pentoxide, tin oxide, zirconium aluminate, zirconium oxide, zirconium oxynitride, zirconium silicon oxynitride, yttrium oxide, yttrium silicon oxides, and admixtures thereof. In one example, gate-dielectric 308 includes $Al_2O_3$. As illustrated in FIG. 3, the thickness of gate-dielectric 308 is indicated by $t_{GateD}$. In one example $t_{GateD}$ may be 1 nm or within a nominal variation thereof. Further, $t_{GateD}$ may be varied proportionally based on changes to dimension and/or parameters of other components of device 300.

In the example illustrated in FIG. 3, spacer 310 and a drain underlap region, having a length indicated by $L_{Underlap}$, are added between gate-layer 312 and drain-layer 306 in order to electrostatically decouple the drain from the channel. Spacer 310 may include any of the dielectric materials described above with respect to gate-dielectric 308. In one example, spacer 310 includes a dielectric having a high dielectric constant as compared to silicon dioxide. In one example, spacer 310 includes $HfO_2$. As illustrated in FIG. 3, the length of spacer is indicated by $L_{Spacer}$. In one example, $L_{Spacer}$ may be 10 nm or within a nominal variation thereof. As further illustrated in FIG. 3, the length of the drain underlap region is indicated by $L_{Underlap}$. In one example, $L_{Underlap}$ may be 10 nm or within a nominal variation thereof. Further, each of $L_{Spacer}$ and/or $L_{Underlap}$ may be varied in response to changes to dimension and/or parameters of other components of device 300.

Source-layer 302, interlayer 304, and drain-layer 306 may be configured to form an n-channel TFET. In one example, source-layer 302 may include p-type GaN and drain-layer 306 may include n-type GaN. In one example, interlayer 304 may include InN. In another example, and as described in further detail below, interlayer 304 may include InN and graded InGaN. Further, in one example, interlayer 304 may include InGaN and graded InGaN. In the example where source-layer 302 includes p-type GaN, drain-layer 306 includes n-type GaN, and interlayer 304 includes InN each of the doping concentrations of source-layer 302 and drain-layer 306, and the dimensions of source-layer 302, drain-layer 304, and interlayer 304 may be modified to achieve desired characteristics for device 300. In one example, device 300 may have a source doping concentration, $N_a$, of $3 \times 10^{19}$ cm$^{-3}$ and channel doping concentration, $N_d$, of $10^{17}$ cm$^{-3}$. It should be noted that this example provides a relatively modest channel doping to facilitate gate electrostatic control of the channel. In other examples, other doping concentrations may be used.

As illustrated in FIG. 3, the thickness of source-layer 302, interlayer 304, and drain-layer 306 are respectively indicated by $t_{Source}$, $t_{Interlayer}$, and $t_{Drain}$. In example, $t_{Source}$ may be 30 nm or within a nominal variation thereof and $t_{Drain}$ may be 2 nm or within a nominal variation thereof. As described above with respect to FIGS. 2A and 2B, the thickness of an InN interlayer may be varied in order to change band gap characteristics. In this manner, $t_{Interlayer}$ may be varied to achieve desired characteristics for device 300. In one example, $t_{Interlayer}$ may be 1.7 nm or within a nominal variation thereof. In one example, $t_{Interlayer}$ may be within the range of 0.1 to 8.0 nm. In one example, $t_{Interlayer}$ may be within the range of 0.1 to 3.0 nm.

Figure 4A:
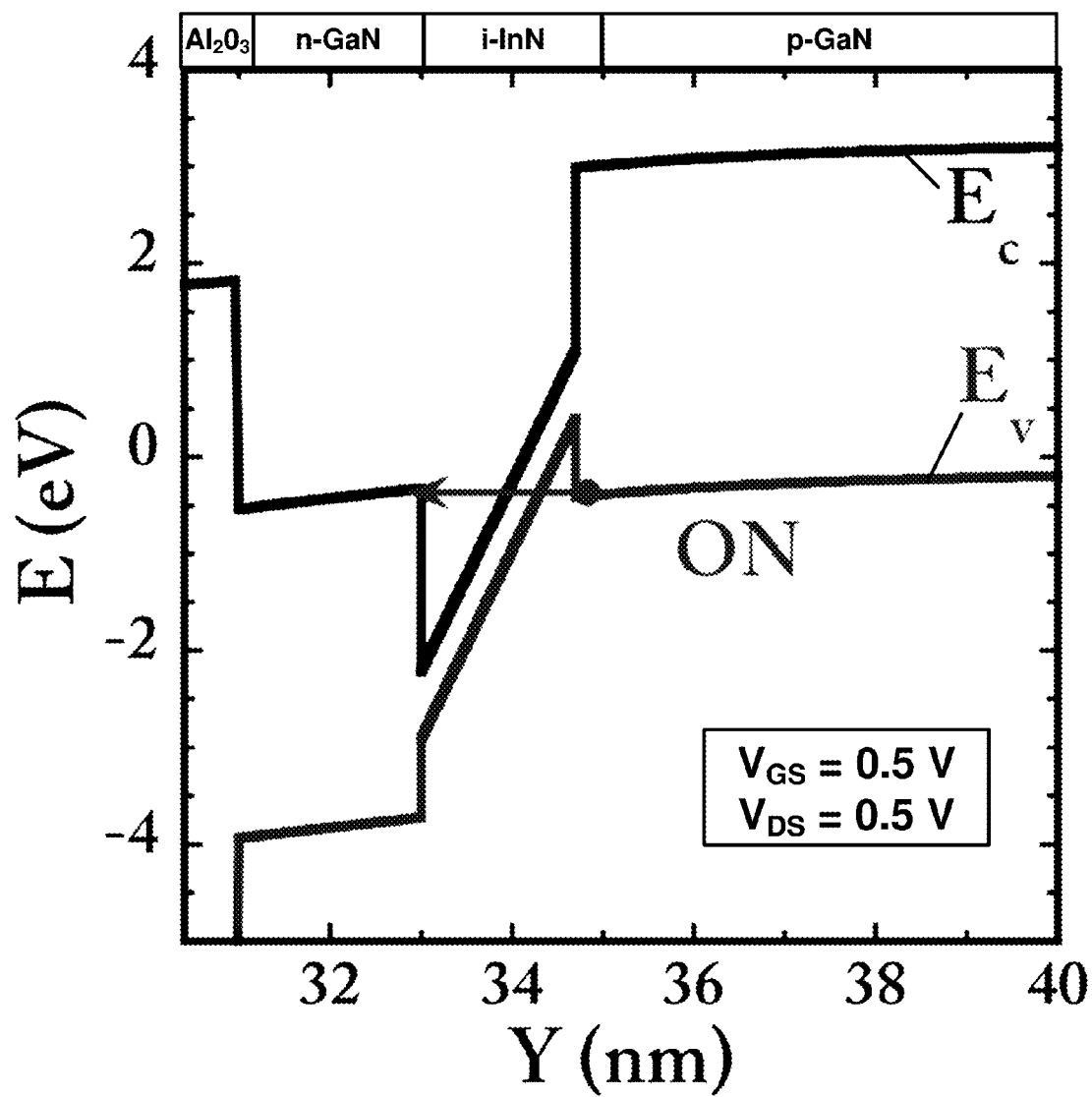
FIG. 4A is a band diagram for an example semiconductor device including a GaN/InN/GaN heterojunction in an on-state according to one or more techniques of this disclosure.
Figure 4B:
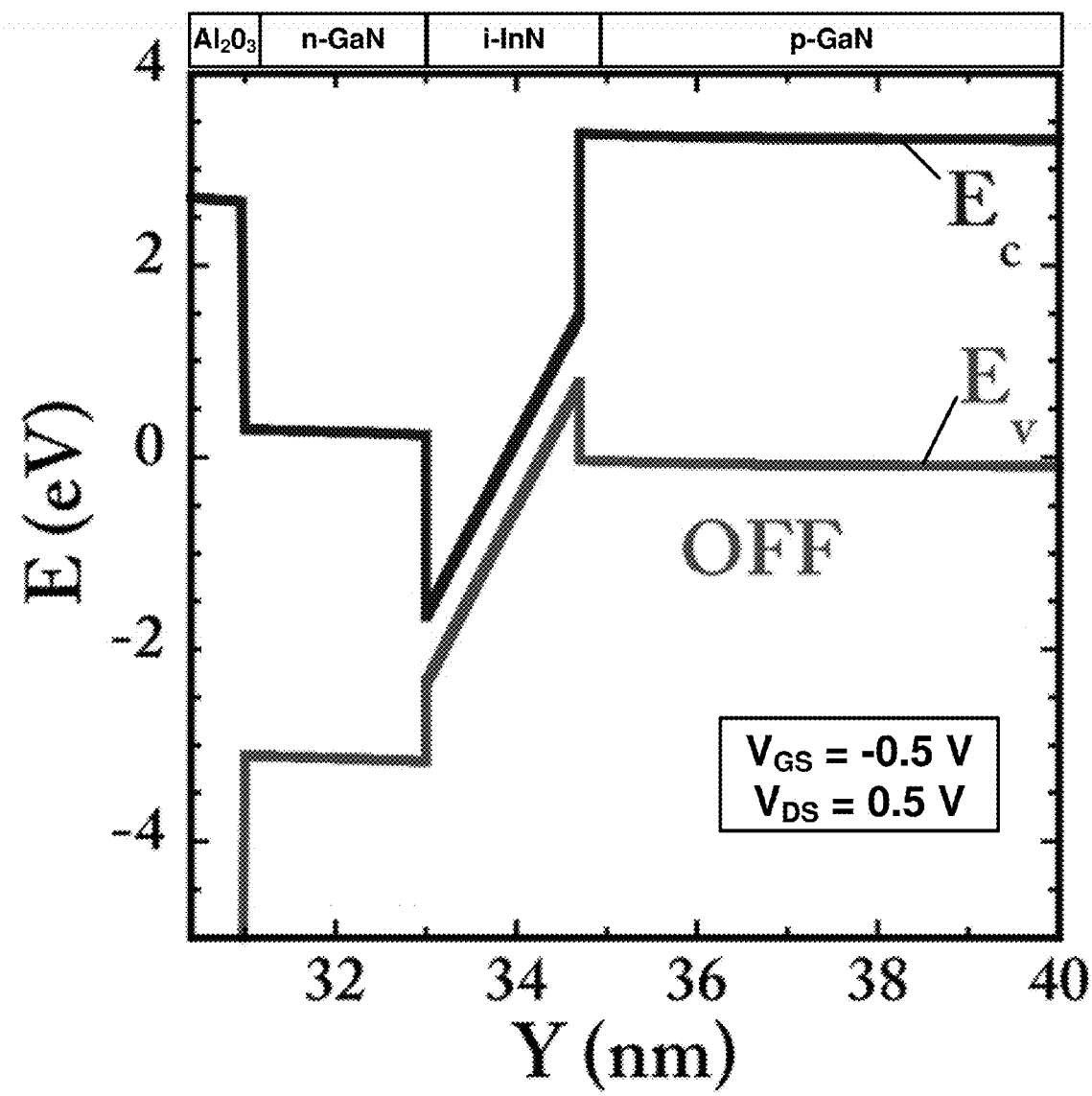
FIG. 4B is a band diagram for an example semiconductor device including a GaN/InN/GaN heterojunction in an off-state according to one or more techniques of this disclosure.

FIG. 4A and FIG. 4B illustrate the operational principle of device 300 based on example parameters and simulated properties. In the examples illustrated in FIGS. 4A and 4B, the following parameters where used for device 300: gate 312 includes gold, spacer 310 includes HfO$_2$, gate-dielectric 308 includes Al$_2$O$_3$, drain-layer 306 includes n-type GaN having a doping concentration of $10^{17}$ cm$^{-3}$, interlayer 304 includes InN, and source-layer 302 includes p-type GaN having a doping concentration of $3 \times 10^{19}$ cm$^{-3}$. Further, in the examples illustrated in FIGS. 4A and 4B, the following dimensions where used for device 300: $L_{Gate}$=20 nm, $L_{Spacer}$=10 nm, $L_{Underlap}$=10 nm, $t_{Gate}$=20 nm, $t_{GateD}$=1 nm, $t_{Interlayer}$=1.7 nm, and $t_{Source}$=30 nm. Further, in the simulations illustrated in FIGS. 4A and 4B, fixed interface charge at the dielectric-semiconductor interfaces have been included based on measured results reported in J. Son, V. Chobpattana, B. M. McSkimming, et al., "Fixed charge in high-k/GaN metal-oxide-semiconductor capacitor structures," Appl. Phys. Lett., vol. 101, no. 10, pp. 102905, September 2012, which is incorporated by reference in its entirety. Table 1 provides additional properties used for the simulations illustrated in FIGS. 4A and 4B.

TABLE 1

| Parameters | GaN | In$_x$Ga$_{1-x}$N |
|---|---|---|
| Band gap E$_g$ (eV) | 3.4 | 1.4x$^2$ − 4.1x + 3.4 |
| Band offset ΔE$_c$ (eV) | 0 | 0.98x$^2$ − 2.87x |

TABLE 1-continued

| Parameters | GaN | In$_x$Ga$_{1-x}$N |
|---|---|---|
| DOS electron effective mass (m$_0$) | 0.2 | 0.2 − 0.13x |
| DOS hole effective mass (m$_0$) | 2.08 | 2.08 − 0.67x |
| Conduction electron effective mass (m$_0$) | 0.2 | 0.2 − 0.13x |
| Conduction hole effective mass (m$_0$) | 0.46 | 0.46 − 0.22x |
| Static dielectric constant ε$_r$ | 10.5 | 10.5 + 3.0x |
| Electron mobility μ$_e$ (cm$^2$/V · s) | 1050 | 1050 |
| Hole mobility μ$_h$ (cm$^2$/V · s) | 20 | 20 |
| Polarization (C/m$^2$) | −0.029 | 0.11x$^2$ + 0.13x − 0.029 |

It should be noted that since strain-induced band structure modification is minor, the tunneling parameters included in Table 1 are for the unstrained case. Referring to the examples illustrated in FIGS. 2A and 2B, the compressively strained InN has a conduction band shift of about 0.45 eV, while valence band shift averages to 0.28 eV based on linear deformation potential theory. In this example, since tunneling mostly happens between p-GaN and n-GaN, the small band gap change of InN does not significantly impact the effective band gap or the tunneling probability.

FIG. 4A and FIG. 4B illustrate respective tunnel junction band diagrams corresponding to an on-state and an off-state for device 300, where an on-state corresponds to gate voltage, $V_{GS}$=0.5 V and drain voltage, $V_{DS}$=0.5 V and an off-state corresponds to $V_{GS}$=−0.5 V and $V_{DS}$=0.5 V. It should be noted that voltage values, i.e., $V_{GS}$ and $V_{DS}$, corresponding to the on-state and off-state of the device may be adjusted through design parameter selection and as such, the use of $V_{GS}$=−0.5 V and $V_{DS}$=0.5 V in the examples illustrated in FIG. 4A and FIG. 4B and the examples described below should not be construed as limiting the techniques described herein. As illustrated in FIG. 4A, when the device 300 is on, electrons tunnel from the p-type GaN source to the n-type GaN channel. The tunneling energy window over which tunneling can occur may be controlled by the gate voltage. In the off state in FIG. 4B, the conduction band in the channel is pulled high enough in energy to preclude direct tunneling from source to channel.

As described in detail below, parameters of source-layer 302, interlayer 304, drain-layer 306, gate-dielectric 308, spacer 310, and gate 312 may be optimized based on one or more simulations. In one example, properties of device 300 may be simulated using two approaches: a commercial drift-diffusion based TCAD package (e.g., Synopsys Sentaurus), and a non-equilibrium Green's function (NEGF) simulator (e.g., NEMO5). It should be noted that in other examples, other semiconductor analysis tools may be used. An example of a TCAD package is described in a Sentaurus Device User Guide Version 1-2013.12, 2013, Synopsys Inc., Mountain View, Calif. and examples of a non-equilibrium NEGF simulator (NEMO5) is described in S. Steiger, M. Povolotskyi, H. Park, et al., "NEMO5: a parallel multiscale nanoelectronics modeling tool", IEEE Trans. Nanotechnol., vol. 10, no. 6, pp. 1464-1474, November 2011 and J. E. Fonseca, T. Kubis, M. Povolotskyi, et al., "Efficient and realistic device modeling from atomic detail to the nanoscale", J. Comput. Electron., vol. 12, no. 4, pp. 592-600, October 2013. As described below, each of these simulation techniques has independent strengths and weaknesses. In one example, for computational efficiency, TCAD may be used for initial design optimization, with promising structures being evaluated using the more physically rigorous NEGF approach.

For the TCAD-based simulations, electrostatics may be simulated by solving Poisson's equation self-consistently with the electron and hole current continuity equations, while the interband tunneling process may be treated by a WKB-based (Wentzel-Kramers-Brillouin) nonlocal band-to-band generation/recombination model. Radiative recombination and Shockley-Read-Hall (SRH) recombination may also be included. Further, because p-type GaN dopant Mg has a deep acceptor level of 160 mV, incomplete acceptor ionization may be included in the Poisson solution. In some examples, quantization effects may not be considered in TCAD simulation. In the example illustrated in FIG. 4A, quantization effects were not included and this simplification results in an underestimate of the on-current because it ignores the possibility of tunneling from source into the quantized states in the triangular quantum well at the InN/n-GaN interface. It should be noted that a TCAD simulation's neglect of quantum confinement may result in an overestimate of the thermionic off-state leakage, as quantization results in an increased effective InN band gap.

To address the quantum confinement and tunneling limitations of the TCAD-based simulations, NEGF-based simulations may be performed. Example NEGF-based NEMO5 simulations may use a finite-element non-linear Poisson equation solver for device electrostatics and an atomistic tight-binding (TB) Hamiltonian with open boundary conditions represented by self-energies for quantum transport calculations. A $sp^3$ orbital nearest-neighbor TB model may be used to represent GaN and InN. An example of a $sp^3$ orbital nearest-neighbor TB model is described in S. Schulz, S. Schumacher, and G. Czycholl, "Spin-orbit coupling and crystal-field splitting in the electronic and optical properties of nitride quantum dots with a wurtzite crystal structure", Eur. Phys. J. B, vol. 64, no. 1, pp. 51-60, January 2008. In experiments, this example model was shown to reproduce the lowest few conduction and valence bands accurately with bulk band gaps and effective masses shown in Table 1. The combined pyro-electric and piezo-electric polarization charge may be entered into the Poisson solver. Ballistic quantum transport simulations may be performed by a method known as Quantum Transmitting Boundary Method (QTBM), (e.g., as described in C. Lent, and D. Kirkner, "The quantum transmitting boundary method", J. Applied Physics, vol. 67, no. 10, pp. 6353-6359, January 1990.) or the wavefunction formalism (e.g., as described in M. Luisier, A. Shenk, W. Fichtner, et al., "Atomistic simulations of nanowires in the $sp^3d^5s^*$ tight-binding formalism: From boundary conditions to strain calculations", Phys. Rev. B, Condens. Matter, vol. 74, no. 20, pp. 205323, November 2006.), which is an equivalent but computationally efficient formulation of NEGF for coherent ballistic transport.

Figure 5A:
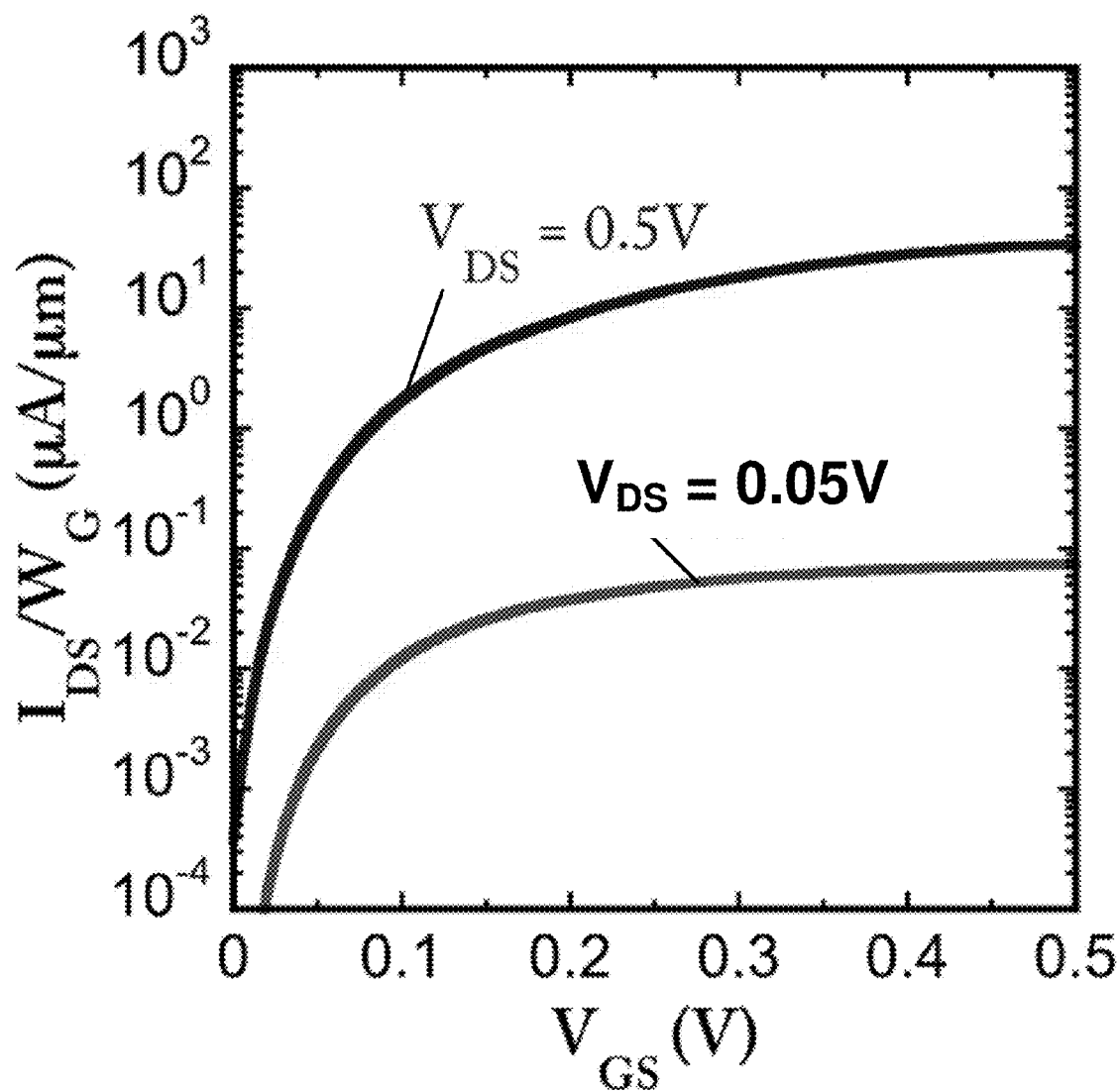
FIG. 5A is a graph illustrating the transfer characteristics of an example semiconductor device including a GaN/InN/GaN heterojunction according to one or more techniques of this disclosure.
Figure 5B:
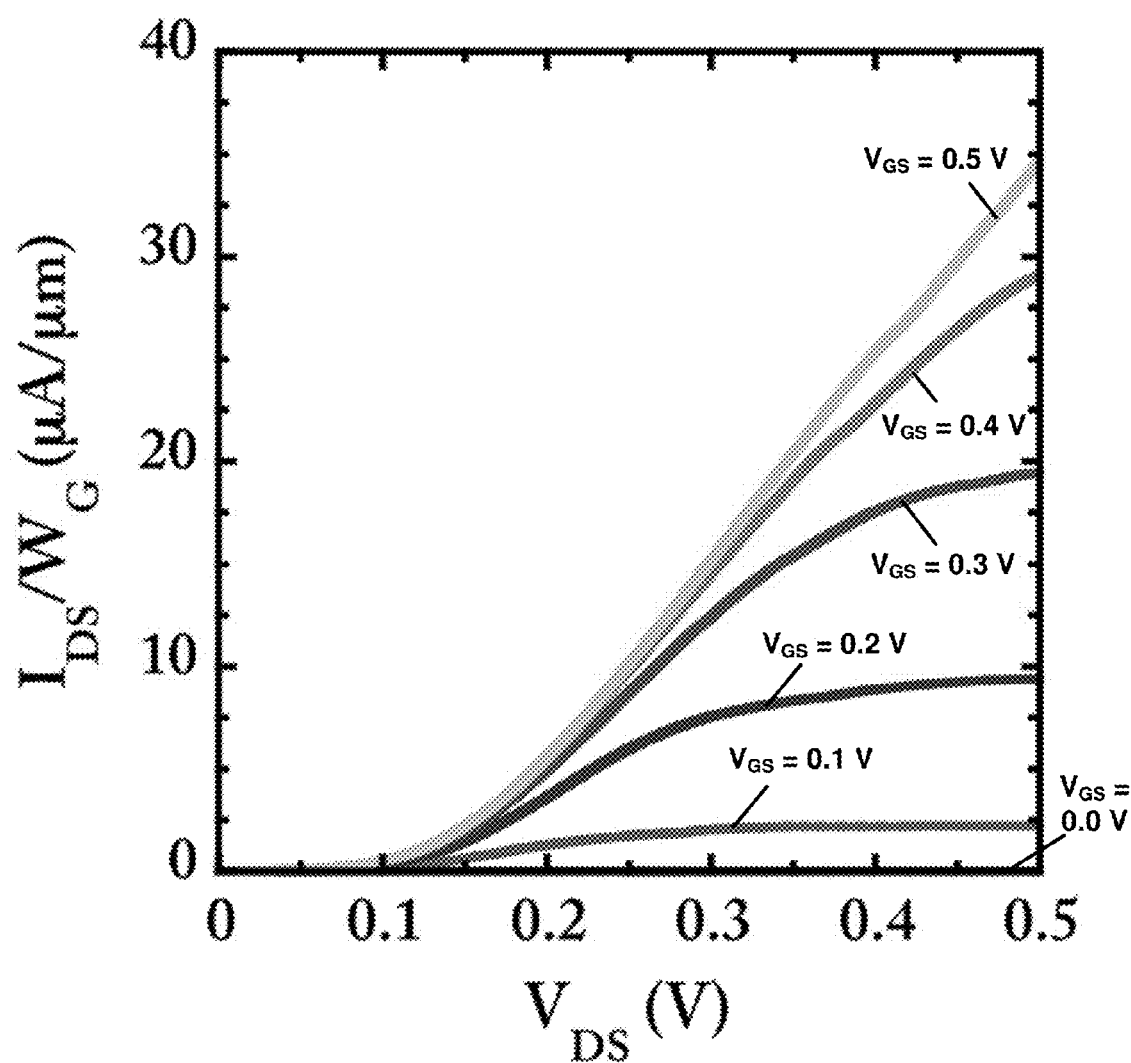
FIG. 5B is a graph illustrating the output characteristics of an example semiconductor device including a GaN/InN/GaN heterojunction according to one or more techniques of this disclosure.

FIG. 5A illustrates example transfer characteristics of device 300. FIG. 5B illustrates example output characteristics of device 300. Each of the example graphs illustrated in FIGS. 5A and 5B were computed using a TCAD simulation. FIG. 5A illustrates the relationship between on-current density and gate voltage for a drain voltages of 0.5 V and 0.05 V. In the example, illustrated in FIG. 5A, device 300 includes an effective oxide thickness (EOT) of 0.43 nm and $t_{interlayer}$ is 1.7 nm. FIG. 5B illustrates the relationship between on-current density and drain voltage for gate voltages of 0.0 V, 0.1 V, 0.2 V, 0.3 V, 0.4 V, and 0.5 volts. For each of the common-source curves illustrated in FIG. 5B, device 300 exhibits an offset voltage in $V_{DS}$ of approximately 0.15 V. It should be noted that this superlinear onset behavior is caused in part by incomplete ionization in the p-GaN region (i.e., the hole concentration in the quasi-neutral source is approximately $4.2 \times 10^{17}$ cm$^{-3}$). Further, the deep acceptors widen the depletion region and cause significant valence band bending in the source with increasing $V_{DS}$. In addition, significant occupancy function modulation with $V_{DS}$ also contributes to the superlinear characteristics. The resulting offset voltage in device 300 output behavior may in some instances be detrimental to sub-0.5 V operation. In part due to this offset, the on-current density in device 300 having the example parameters provided above may be limited to approximately 35 µA/µm.

Figure 6:
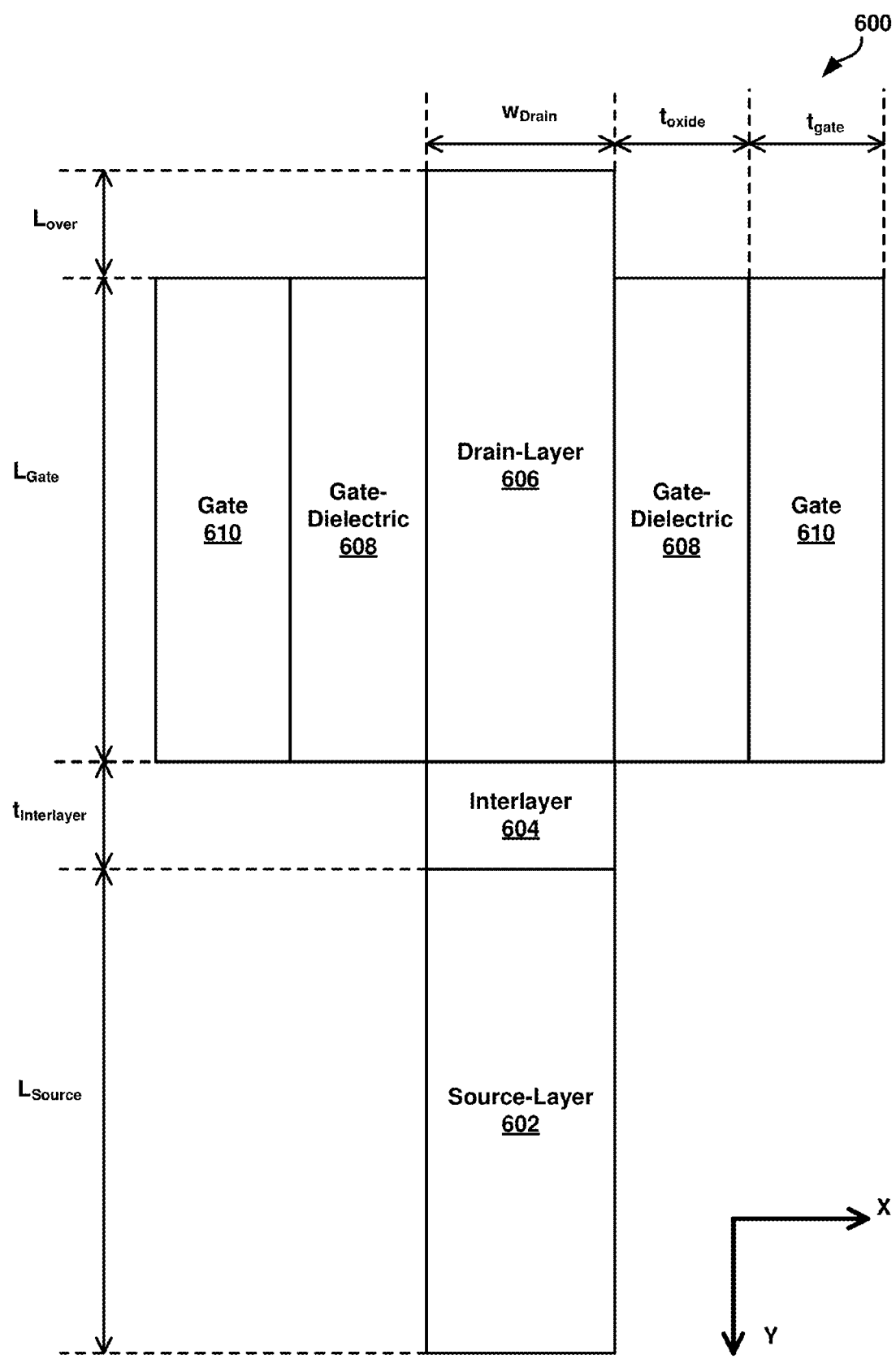
FIG. 6 is a conceptual drawing illustrating an example TFET semiconductor device according to one or more techniques of this disclosure.

As described above, GaN/InN/GaN heterojunction may enable a diverse range of TFETs to be developed. FIG. 6 is a conceptual drawing illustrating an example TFET semiconductor device including a GaN/InN/GaN heterojunction according to one or more techniques of this disclosure. Device 600 may be referred to as a sidewall double-gate TFET with tunnel junction perpendicular to the gate electrode. It should be noted that although TFET devices having side-wall geometries have been explored theoretically and demonstrated experimentally, these TFET devices do not contemplate the use of the heterojunctions as described herein. FIG. 6 provides a cross-sectional view of device 600. It should be noted that in some implementations device 600 may be mirrored about the Y-axis. Further, it should be noted that device 600 may include one or more contacts (e.g., source contact, drain contact, etc.), which for the sake of brevity are not illustrated in FIG. 6. As illustrated in FIG. 6, device 600 includes source-layer 602, interlayer 604, drain-layer 606, gate-dielectric 608, and gate 610. In a manner similar to that described above with respect to device 300 the parameters and dimensions of each of source-layer 602, interlayer 604, drain-layer 606, gate-dielectric 608, and gate 610 may be optimized based on one or more simulations.

Gate 610 may be composed of materials described above with respect to gate 302 and gate-dielectric 608 may be composed of materials described above with respect to gate-dielectric 308. In one example, gate 610 may include gold and gate-dielectric 608 may include $Al_2O_3$. As illustrated in FIG. 6, the thickness of gate dielectric may be indicated by $t_{oxide}$ and the thickness of gate may be indicated by $t_{gate}$. In one example, $t_{oxide}$ may be 1 nm or a nominal variation thereof. In one example, $t_{gate}$ may be 10 nm or a nominal variation thereof.

In a manner similar to source-layer 302, interlayer 304, and drain-layer 306 source-layer 602, interlayer 604, and drain-layer 606, may be configured to form an n-channel TFET. In one example, source-layer 602 may include p-type GaN and drain-layer 606 may include n-type GaN. In one example, interlayer 604 may include InN. In another example, and as described in further detail below, interlayer 304 may include InN and graded InGaN. In the example where source-layer 602 includes p-type GaN, drain-layer 606 includes n-type GaN, and interlayer 604 includes InN each of the doping concentrations of source-layer 602 and drain-layer 606, and the dimensions of source-layer 602, drain-layer 604, and interlayer 604 may be modified to achieve desired characteristics for device 600. In one example, device 600 may have a source doping concentration, $N_a$, of $3 \times 10^{19}$ cm$^{-3}$ and channel doping concentration, $N_d$, of $10^{17}$ cm$^{-3}$. In other examples, other doping concentrations may be used.

As illustrated in FIG. 6, the length of source-layer 602 and drain-layer 606, and thickness of the interlayer 604 are respectively indicated by $L_{Source}$, the sum of $L_{Gate}$ and $L_{over}$, and $t_{interlayer}$. Further, the width of source-layer 602, interlayer 604, and drain-layer 606 is indicated by $w_{Drain}$. In one example, $w_{Drain}$ may be 12 nm or a nominal variation thereof. In one example, $L_{Source}$ may be 25 nm or within a nominal variation thereof, $L_{Gate}$ may be 20 nm or within a nominal variation thereof, and $L_{over}$ may be 5 nm or within a nominal variation thereof. As described above with respect to FIGS. 2A and 2B, the dimensions of an InN interlayer may be varied in order to change band gap characteristics. In this manner, $t_{Interlayer}$ may be varied to achieve desired characteristics for device 600. In one example, $t_{Interlayer}$ may be 1.7 nm or within a nominal variation thereof. In one example, $t_{interlayer}$ may be with the range of 0.1 to 3.0 nm. It should be noted that in one example, $L_{Gate}$ was selected to be 20 nm based on current manufacturing capabilities and dimensions and parameters of other components were selected based on the selection of $L_{Gate}$. In other examples, dimensions and parameters of other components could be selected based on different selected values of $L_{Gate}$.

In a manner similar to that described above with respect to device 300, the operational principle of device 600 may be illustrated based on example parameters and simulated properties. For the sake of brevity, a discussion of simulations for device 600 will not be provide herein. However, it should be note that device 600 has a similar operational principle to device 300.

As described above, the on-current density of device 300 having the example parameters provided above may be limited to approximately 35 µA/µm. Similar limitations may be expected for device 600. In one example, to address this limitation, polarization-assisted p-type doping may be used to facilitate deep acceptor ionization in a p-GaN source region. Further, in one example, a graded $In_xGa_{1-x}N$ layer may be added between the InN and p-GaN layer in each of device 300 and device 600 (i.e., between source layer 302 and interlayer 304 in device 300 and source layer 302 and interlayer 604 in device 600). In one example, a graded $In_xGa_{1-x}N$ layer may have an In mole fraction that is linearly graded from 0 to 1.

Figure 7:
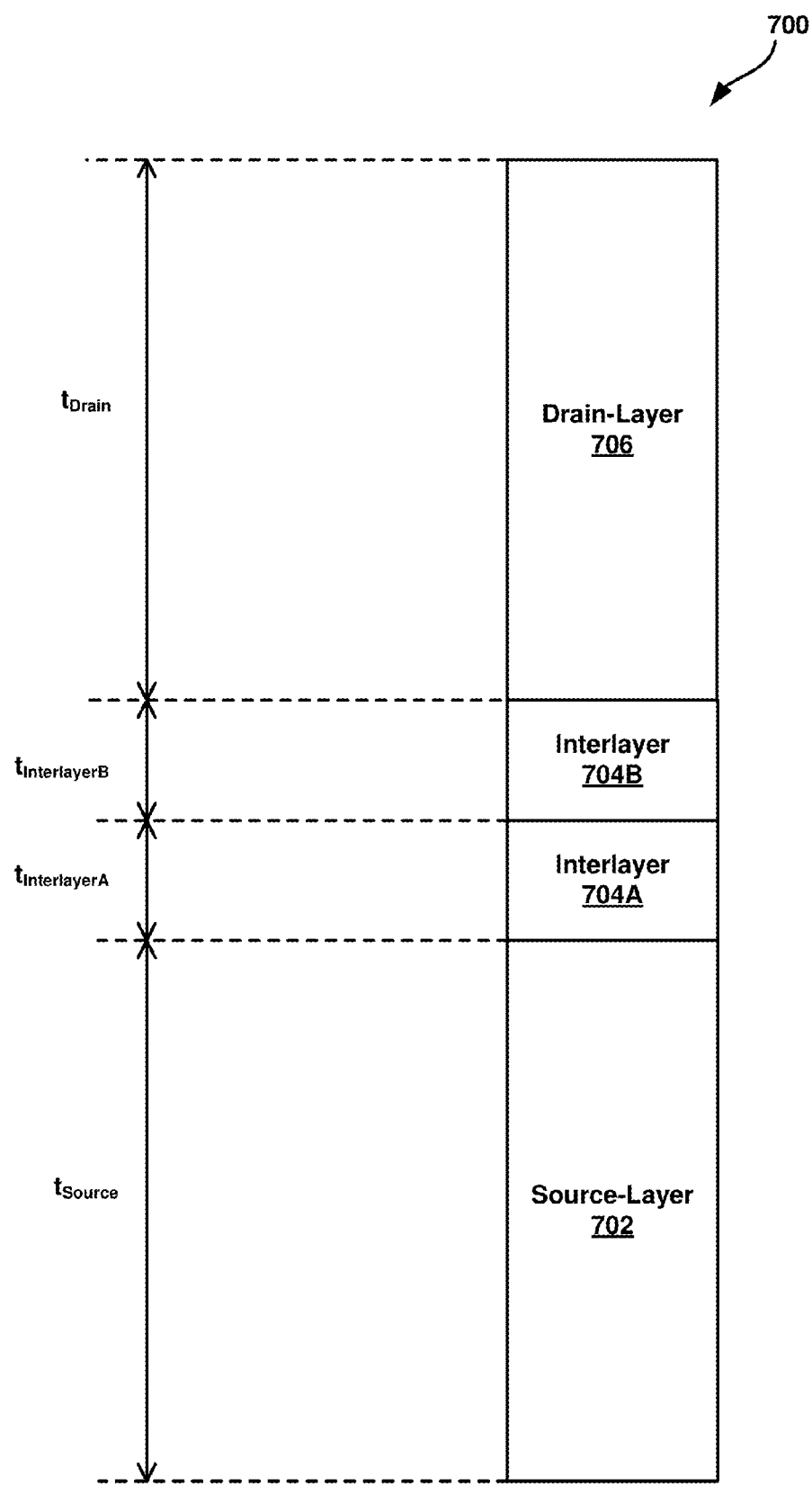
FIG. 7 is a conceptual drawing illustrating an example epitaxial structure that may be used in TFET semiconductor devices according to one or more techniques of this disclosure.

FIG. 7 illustrates an example of an epitaxial structure that may be used in TFET semiconductor devices. Structure 700 includes source-layer 702, interlayer 704A, interlayer 704B, and drain-layer 706. Source-layer 702 may be similar to source-layer 302 and source-layer 602 described above and $t_{Source}$ illustrated in FIG. 7, may be similar to $t_{Source}$ described above with respect to FIG. 3 and $L_{Source}$ described above with respect to FIG. 6. Drain-layer 706 may be similar to drain-layer 306 and drain-layer 606 described above and $t_{Drain}$ illustrated in FIG. 7, may be similar to $t_{Drain}$ illustrated in FIG. 3 and $L_{over}$ and $L_{Gate}$ illustrated in FIG. 6. Interlayer 704A may include a graded $In_xGa_{1-x}N$ layer and interlayer 704B may include InN layer. As described in detail below, parameters and dimensions of each of interlayer 704A and interlayer 704B may be varied to achieve desired operating characteristics for a semiconductor device including structure 700. As illustrated in FIG. 7, the thickness of interlayer 704A and interlayer 704B are respectively indicated by $t_{interlayerA}$ and $t_{interlayerB}$. In one example, $t_{interlayerA}$ may be 0.6 nm or a nominal variation thereof and $t_{interlayerB}$ may be 1.7 nm or a nominal variation thereof. In one example, the sum of $t_{interlayerA}$ and $t_{interlayerB}$ may be within the range of 0.1 to 8.0 nm. In one example, the sum of $t_{interlayerA}$ and $t_{interlayerB}$ may be within the range of 0.1 to 3.0 nm.

Figure 8A:
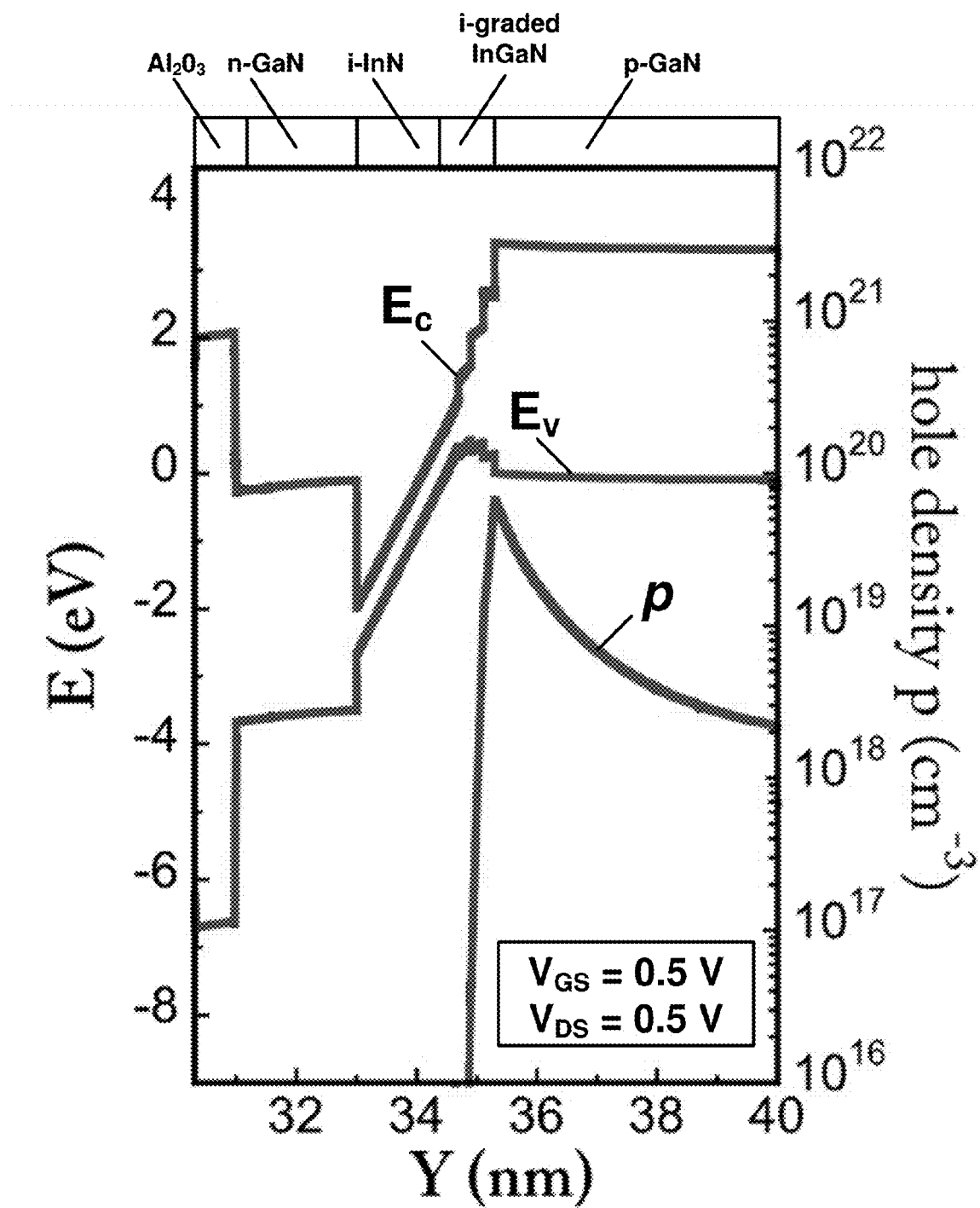
FIG. 8A is a band diagram for an example semiconductor device including a GaN/InN/graded InGaN/GaN heterojunction in an on-state according to one or more techniques of this disclosure.
Figure 8B:
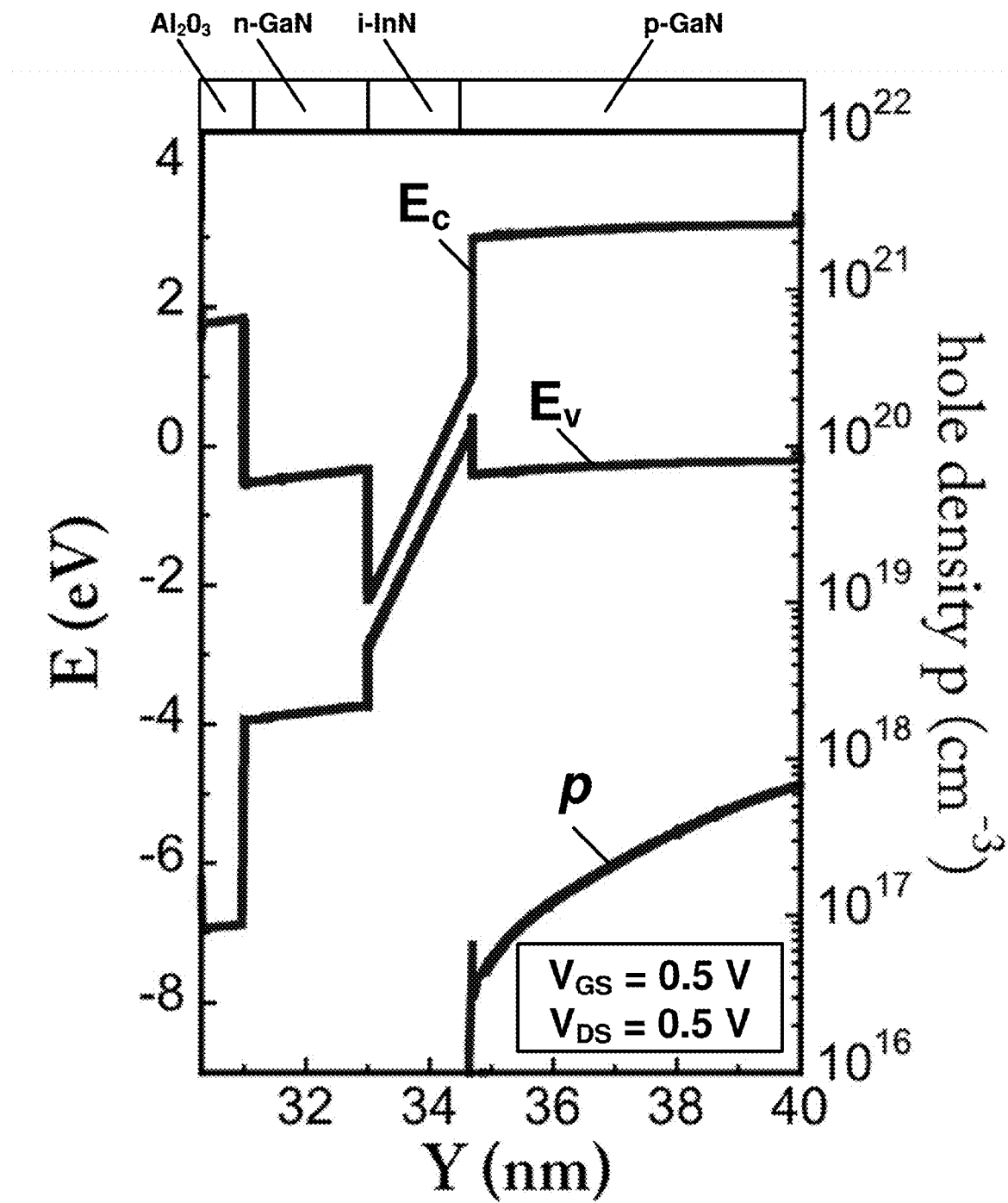
FIG. 8B is a band diagram for an example semiconductor device including a GaN/InN/GaN heterojunction in an on-state according to one or more techniques of this disclosure.

FIG. 8A illustrates a tunnel junction band diagram corresponding to a device including structure 700 in an on-state. FIG. 8A also illustrates hole concentration, p, as a function of position. In the example illustrated in FIG. 8A interlayer 704A includes a graded $In_xGa_{1-x}N$ layer and interlayer 704B includes InN layer, where $t_{interlayerA}$ is a 0.6 nm and interlayer 704A is linear staircase/step graded from 0 to 1 and $t_{interlayerB}$ is 1.7 nm. FIG. 8B illustrates a tunnel junction band diagram corresponding to a device including GaN/InN/GaN heterojunction in an on-state. FIG. 8A also illustrates hole concentration, p, as a function of position. FIG. 8A and FIG. 8B may be compared to demonstrate the operational characteristics of a device including a GaN/InN/graded InGaN/GaN heterojunction compared to a device including a GaN/InN/GaN heterojunction. As illustrated in FIG. 8A and FIG. 8B, the fixed polarization charge in the graded InGaN (which may be caused by the polarization grading through $\rho = -\nabla \cdot \vec{P}$) creates a built-in electric field and causes energy-band bending in the source region. As a consequence, the hole density (p) in the on-state at the source/InN interface is increased by nearly three orders of magnitude (i.e., effective degenerate doping in the p-GaN source) compared to the case of an abrupt GaN/InN/GaN heterojunction, as shown in the figures. Similar to degenerately doping the source region of the narrow band gap material-based TFET, the polarization-enhanced source doping reduces the depletion width in p-GaN, shortens the tunneling width and enables high on-current in III-nitride TFETs.

Figure 9A:
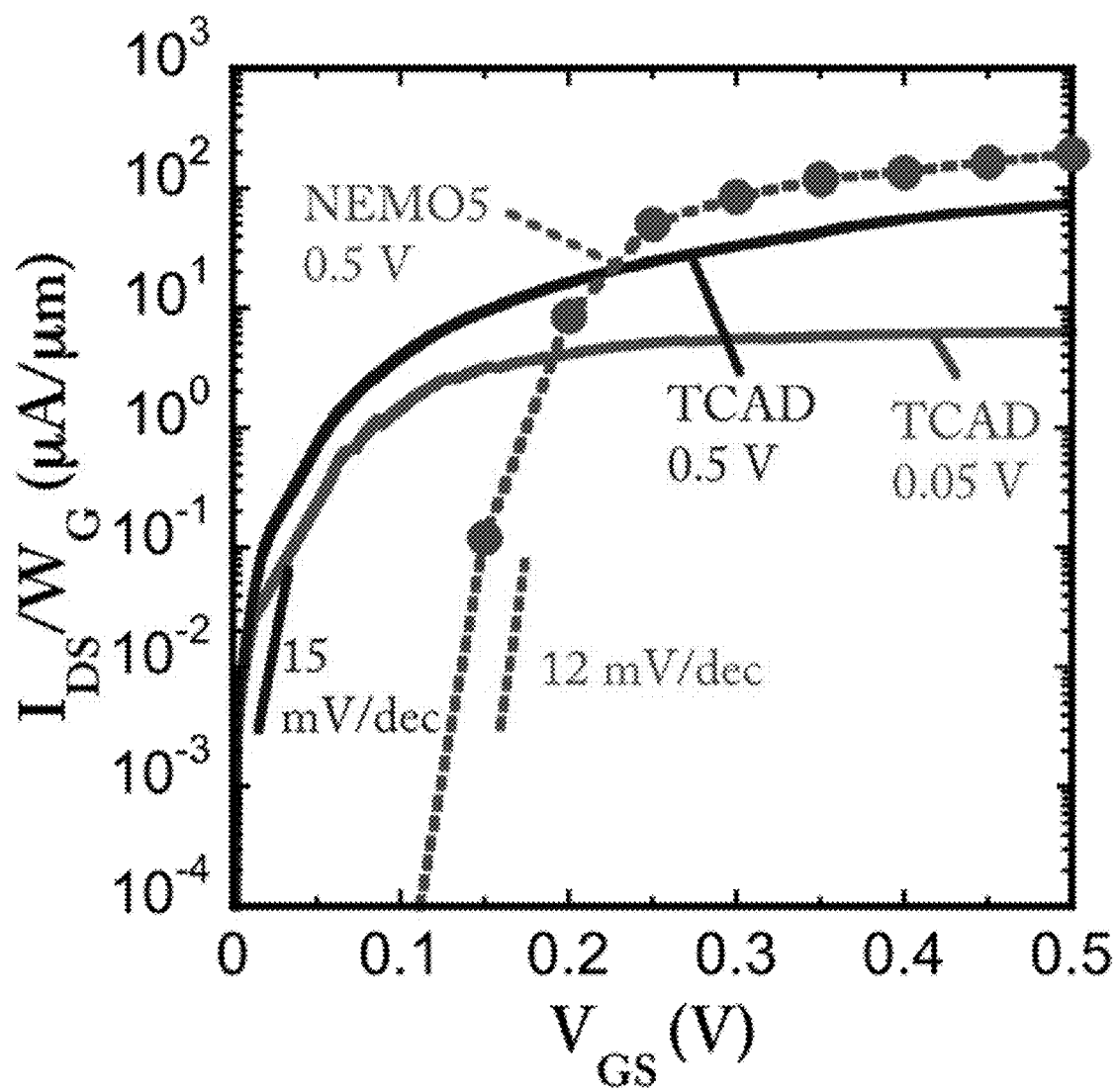
FIG. 9A is a graph illustrating the transfer characteristics of an example semiconductor device including a GaN/InN/graded InGaN/GaN heterojunction according to one or more techniques of this disclosure.
Figure 9B:
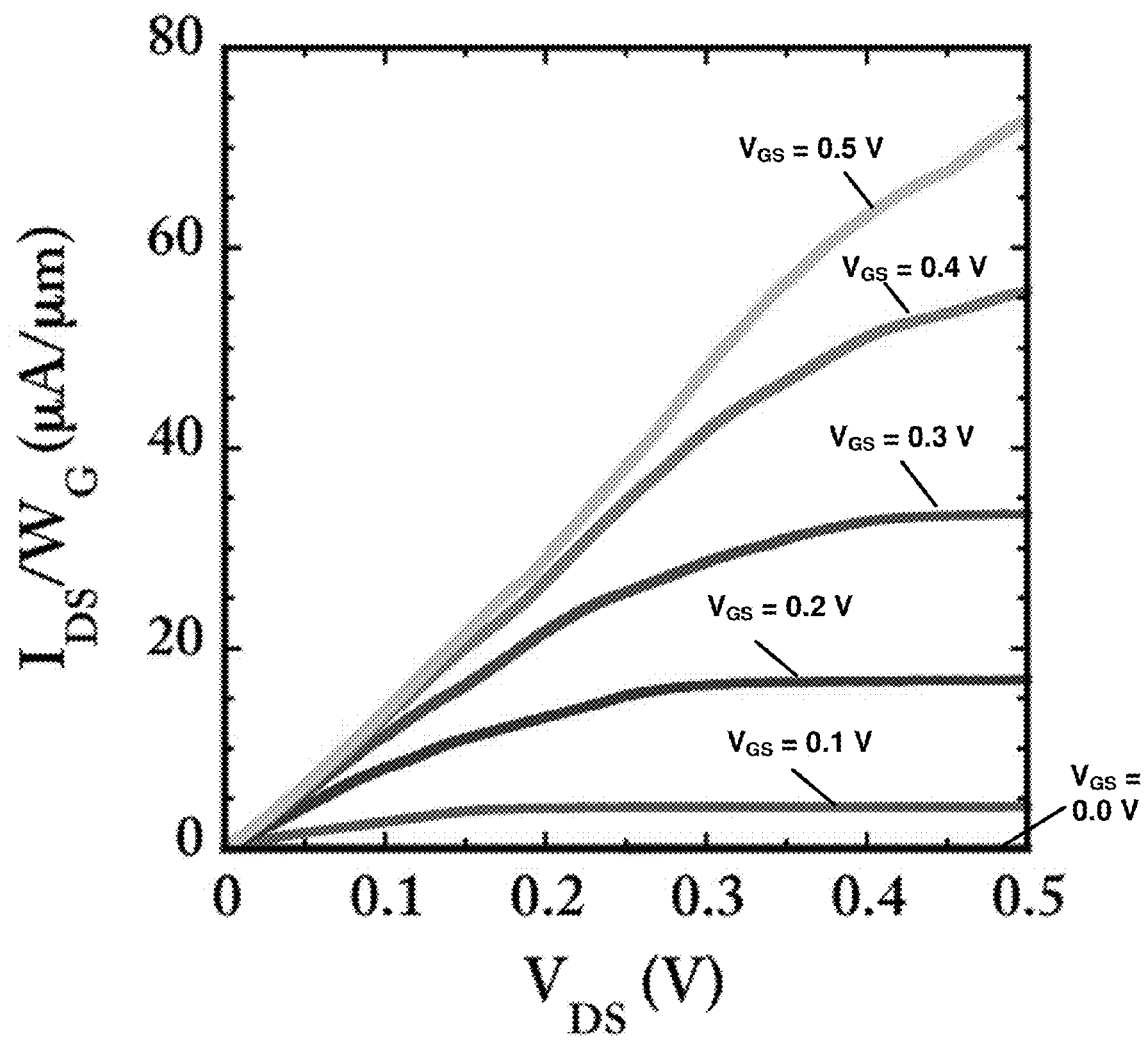
FIG. 9B is a graph illustrating the output characteristics of an example semiconductor device including a GaN/InN/graded InGaN/GaN heterojunction according to one or more techniques of this disclosure.
Figure 10A:
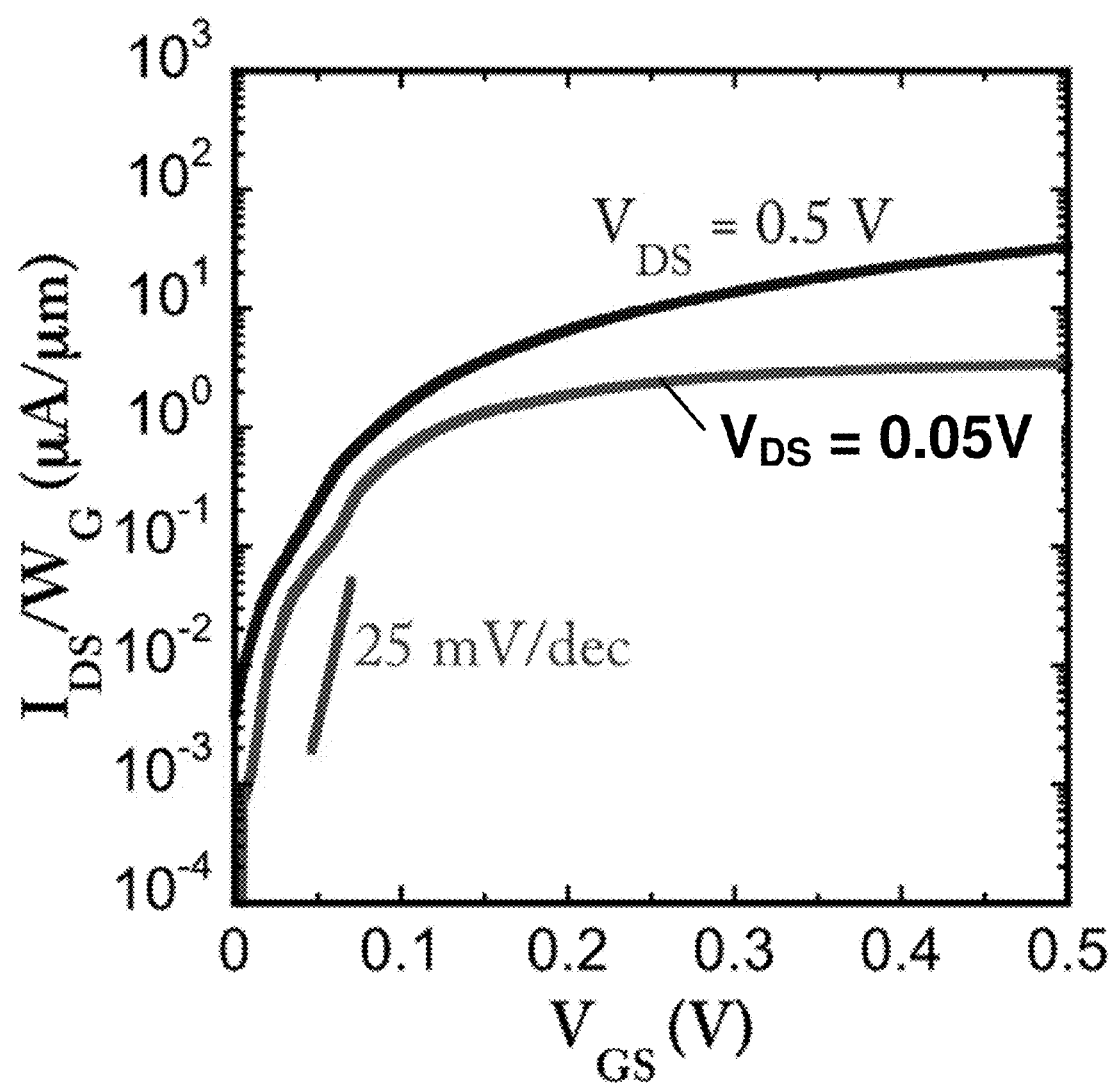
FIG. 10A is a graph illustrating the transfer characteristics of an example semiconductor device including a GaN/InN/graded InGaN/GaN heterojunction according to one or more techniques of this disclosure.
Figure 10B:
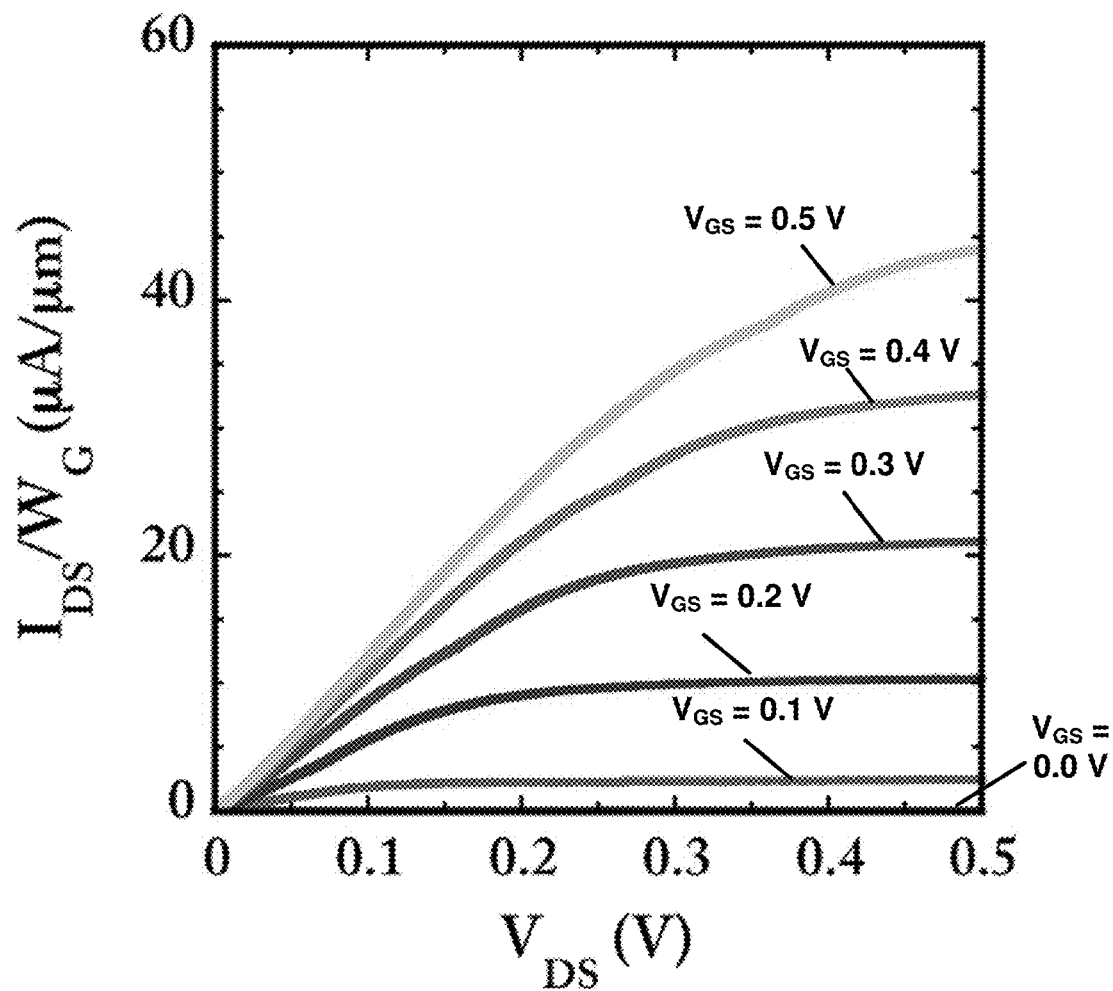
FIG. 10B is a graph illustrating the output characteristics of an example semiconductor device including a GaN/InN/graded InGaN/GaN heterojunction according to one or more techniques of this disclosure.

As described above, a graded $In_xGa_{1-x}N$ layer may be added between a InN and p-GaN layer in each of device 300 and device 600. FIG. 9A is a graph illustrating the transfer characteristics of an example semiconductor device including an example in-line geometry of device 300 and structure 700. FIG. 9B is a graph illustrating the output characteristics of an example semiconductor device including example in-line geometry of device 300 and structure 700. FIG. 10A is a graph illustrating the transfer characteristics of an example semiconductor device including example sidewall geometry of device 600 and structure 700. FIG. 10B is a graph illustrating the output characteristics of an example semiconductor device including example sidewall geometry of device 600 and structure 700. In the examples illustrated in FIGS. 9A-10B, interlayer 704A includes a graded $In_xGa_{1-x}N$ layer and interlayer 704B includes InN layer, where $t_{interlayerA}$ is a 0.6 nm and interlayer 704A is linearly graded from 0 to 1 and $t_{interlayerB}$ is 1.7 nm and a device includes an EOT of 0.43 nm. It should be noted that in other examples other types of grading may be used (non-linear, including quadratic, etc.).

Each of the example graphs illustrated in FIGS. 9A and 9B were computed using a TCAD simulation (solid lines) or NEMO5 (dashed line in FIG. 9A). FIG. 9A illustrates the relationship between on-current density and gate voltage for a drain voltages of 0.5 V and 0.05 V. FIG. 9B illustrates the relationship between on-current density and drain voltage for gate voltages of 0.0 V, 0.1 V, 0.2 V, 0.3 V, 0.4 V, and 0.5 volts. From the TCAD-calculated in-line TFET transfer curve in FIG. 9A, an on-current of 73 µA/µm, on-off ratio of $10^5$ and SS of 15 mV/dec are determined. As can be seen in FIG. 9B, the graded InGaN layer also mitigates the effect of the Mg deep acceptor in p-GaN; the offset $V_{DS}$ in the output onset has been eliminated, and a sharp linear turn-on characteristic is obtained. Current saturation with $V_{DS}$ is observed at low $V_{GS}$ in FIG. 9B, as may be required for logic and analog functions. These promising performance metrics have been replicated with NEGF simulations as illustrated in FIG. 9A. In the example, NEGF simulation illustrated in FIG. 9A, an on-current of 195 µA/µm, minimum SS of 12 mV/decade, and $I_{ON}/I_{OFF}$ of $10^7$ have been computed. It should be noted that the observed disparity in performance projections between NEGF and TCAD is not entirely unexpected. While NEGF treats the interband tunneling more rigorously than the WKB-based approach implemented in TCAD, including the effects of tunneling through quantized states near the heterointerface, the NEGF solver used for these projections does not include scattering. Thus the NEGF simulation provides a rigorous estimate of the device ballistic limit, while the TCAD provides insight into the role of extrinsic parasitics such as source and drain access resistances on device performance.

It should be noted that slightly different threshold voltages (differing by approximately 0.1 V) are also predicted by the two simulators, as shown in FIG. 9A. This is due to the differences between neglecting quantum confinement (TCAD) and including it (NEGF). As can be seen in FIG. 9B, the output conductance degrades at large $V_{GS}$, due to drain-gate coupling (i.e., drain induced barrier thinning). The access resistance contributes to the non-monotonic transconductance behavior in FIG. 9B. Since p-GaN has a small hole mobility, approximately 20 cm$^2$/V·s and a modest hole density in the bulk source region due to incomplete ionization, the source series resistance is estimated to be 2.18 kΩ-μm. Due to the ultra-thin n-GaN channel (i.e., 2 nm thick) and its low doping concentration, the extrinsic access region of the drain contributes 1.52 kΩ-μm to the total access resistance. In the on-state ($V_{GS}=V_{DS}=0.5$ V), the voltage drop across the source bulk region is approximately 0.15 V, while the drain access resistance exhibits a drop of 0.1 V. Thus, in one case, for an example semiconductor device including an example in-line geometry of device 300 and structure 700 nearly half of the applied drain voltage may be dropped in the access resistances, contributing to the limited on-current and compromising the current saturation.

Referring to FIG. 10A and FIG. 10B, each of the example graphs illustrated in FIGS. 10A and 10B were computed using a TCAD simulation. FIG. 10A illustrates the relationship between on-current density and gate voltage for a drain voltages of 0.5 V and 0.05 V. FIG. 10B illustrates the relationship between on-current density and drain voltage for gate voltages of 0.0 V, 0.1 V, 0.2 V, 0.3 V, 0.4 V, and 0.5 volts. Based on full-band atomistic tight-binding calculations, the quantization-induced band gap change for a 12 nm thick InN body is approximately 28 meV, (and smaller for GaN), due to their relatively large effective masses, indicating that lateral quantization effects can be neglected. In comparison to the in-line geometry, the sidewall TFET including structure 700 shows a modestly-reduced $I_{ON}$ and slightly higher SS. In the example illustrated in FIG. 10A and FIG. 10B, these differences have to do with choices made to improve the electrostatic gate control. For example, the channel thickness may be set to 12 nm to achieve good gate control of the channel. However, this also results in a smaller tunnel junction cross-sectional area and thus a smaller $I_{ON}$ compared with the in-line TFET at the same gate length. To mitigate the trade-off between electrostatic control and tunnel junction area, in some examples, a gate-all-around nanowire TFET device may be preferable to a double-gate structure.

Figure 11:
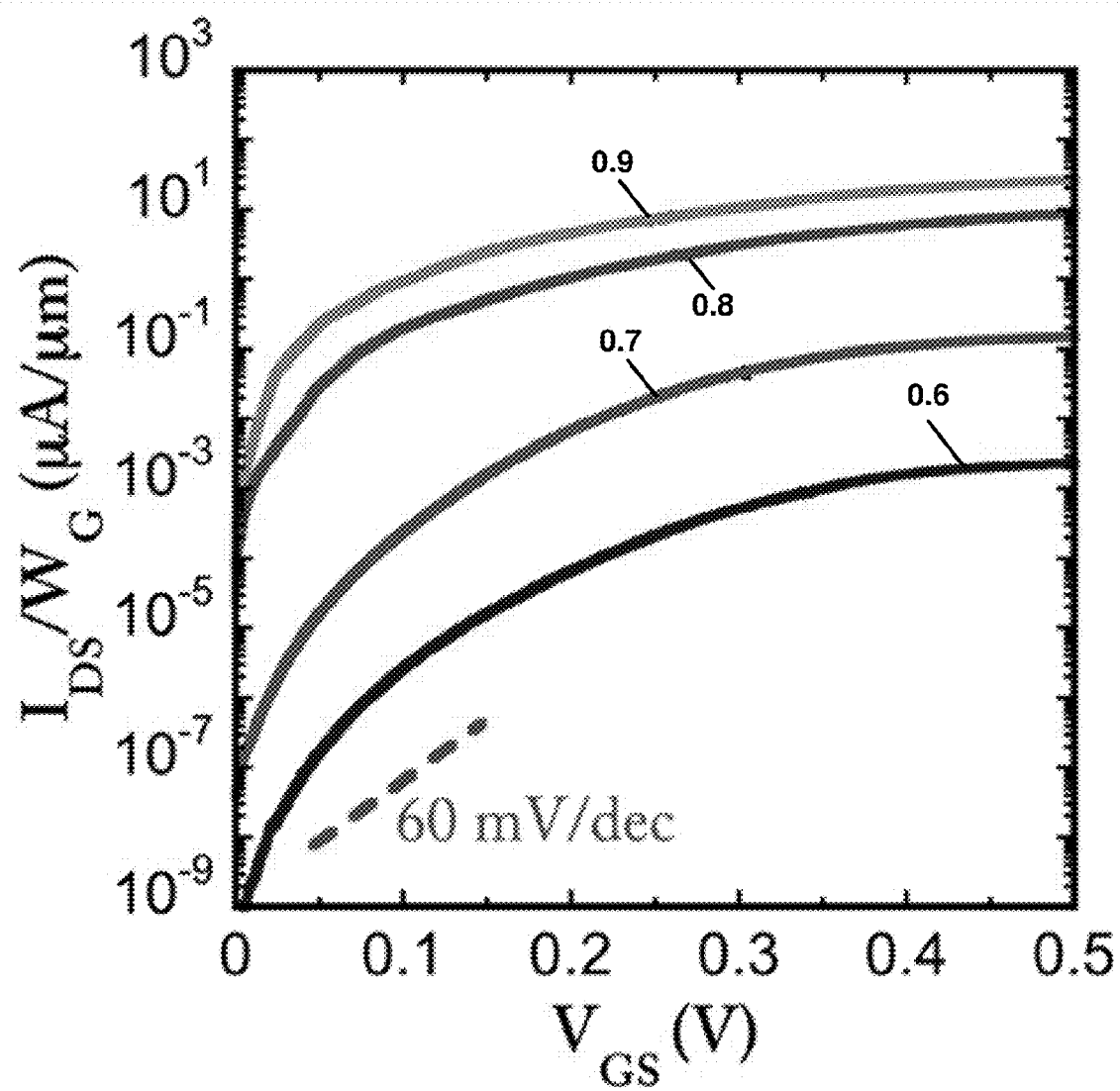
FIG. 11 is a graph illustrating the transfer characteristics of an example semiconductor device including a GaN/In$_x$Ga$_{1-x}$N/graded InGaN/GaN heterojunction according to one or more techniques of this disclosure.

It should be noted that due to challenges associated with the epitaxial growth of GaN/InN/GaN heterojunctions, which may originate principally from the significant difference in optimal growth temperature for InN and GaN by molecular beam epitaxy (MBE) and their lattice mismatch, in some instances, in may be desirable to have a lower In-content in GaN/InGaN/graded InGaN/GaN heterojunctions. FIG. 11 is a graph illustrating the transfer characteristics for an in-line TFET geometry based on GaN/In$_x$Ga$_{1-x}$N/graded-InGaN/GaN heterojunction, with In mole fraction from 0.6 to 0.9. In the example illustrated in FIG. 11, the calculated results are from TCAD simulations. In the example illustrated in FIG. 11, steep switching slopes smaller than 60 mV/dec can be observed for In mole fraction from 0.6 to 0.9. Compared with the InN interlayer case, described above, the reduced indium concentration results in larger effective band gap and a smaller polarization charge at the heterointerface, primarily from the reduced piezoelectric contribution. This results in a smaller junction electric field and a reduced $I_{ON}$ as shown in FIG. 11.

Figure 12A:
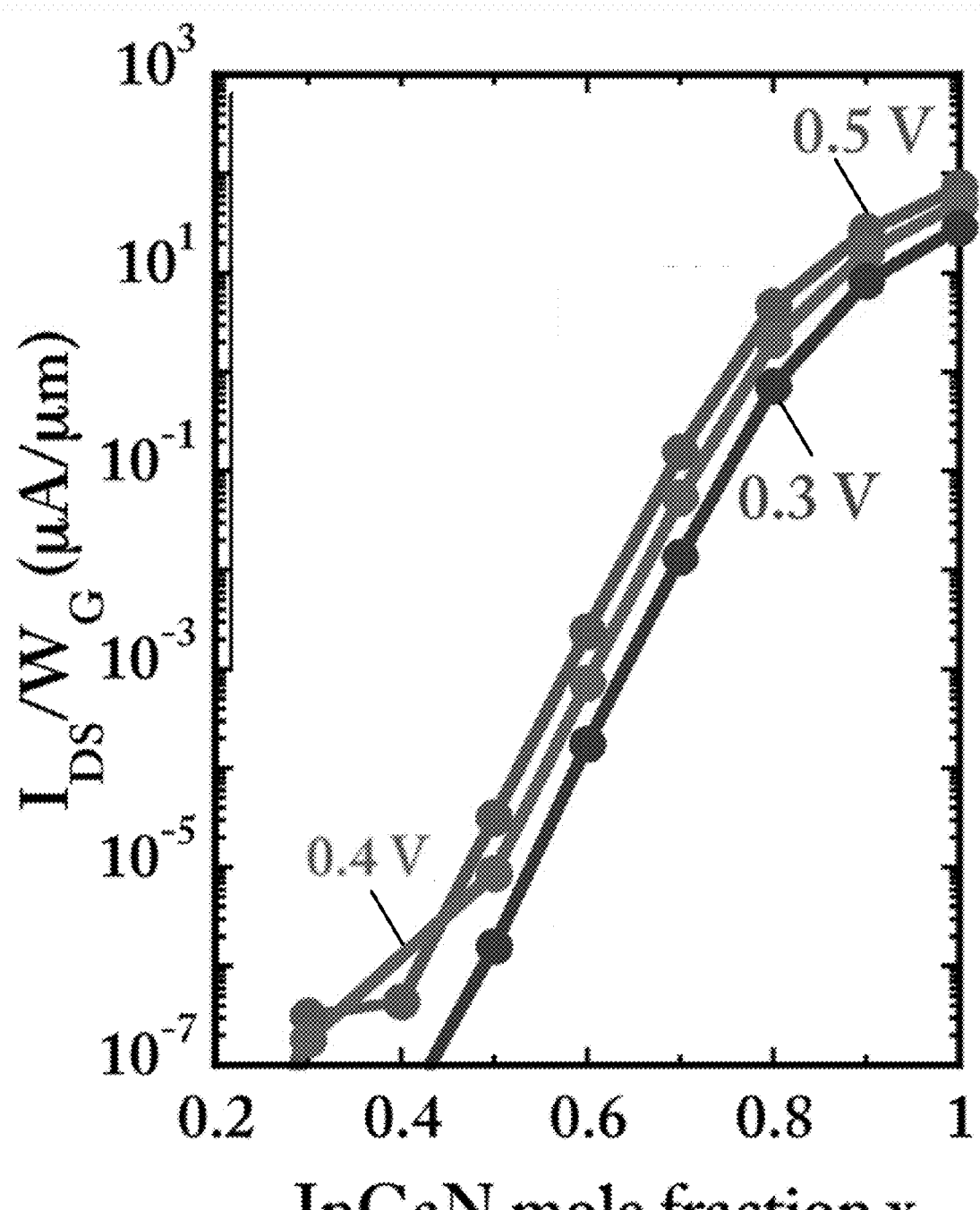
FIG. 12A is a graph illustrating the on-current characteristics of an example semiconductor device including a GaN/In$_x$Ga$_{1-x}$N/graded InGaN/GaN heterojunction according to one or more techniques of this disclosure.

Further, to analyze the dependence of the on-current on InGaN interlayer In mole fraction, for a given interlayer thickness, a simulated on-current may be plotted for different In mole fractions as a function of supply voltage. FIG. 12A is a graph illustrating the on-current for an in-line TFET geometry based on GaN/In$_x$Ga$_{1-x}$N/graded-InGaN/GaN heterojunction. In the example illustrated in FIG. 12, the graded-InGaN thickness is a 0.6 nm and the In$_x$Ga$_{1-x}$N thickness is 1.7 nm. FIG. 12A provides an example of on-current dependence on InGaN interlayer In mole fraction at supply voltages of 0.3, 0.4 and 0.5 V. The calculated results shown in FIG. 12A are from TCAD simulations. As illustrated in FIG. 12A the on-current monotonically increases with In mole fraction.

Figure 12B:
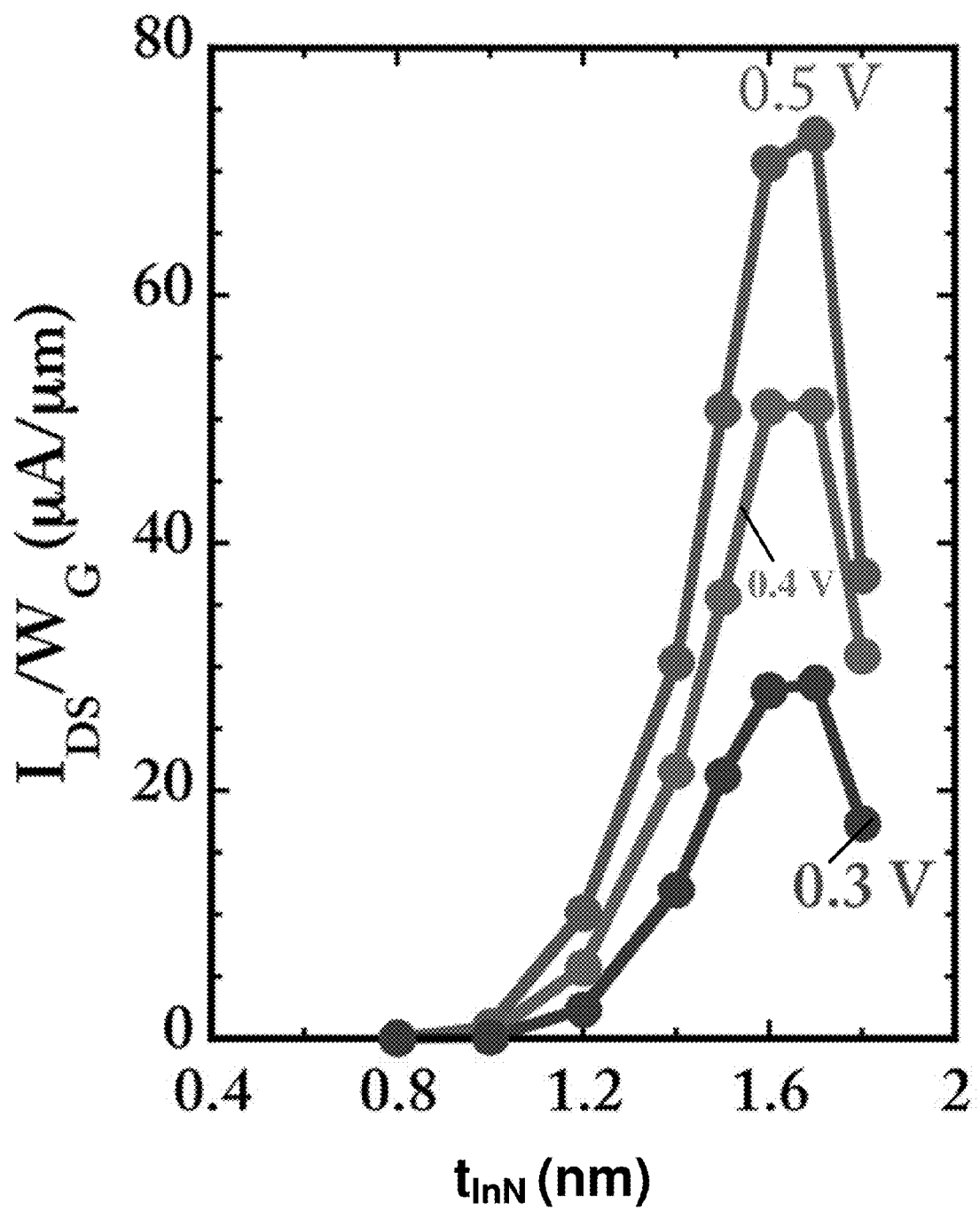
FIG. 12B is a graph illustrating the on-current characteristics of an example semiconductor device including a GaN/InN/graded InGaN/GaN heterojunction according to one or more techniques of this disclosure.

Another important variable in III-nitride TFET epitaxial design is the InN thickness. For GaN/InN/graded-InGaN/GaN heterojunctions, as the InN thickness increases, both the effective band offset and the tunneling distance increase. The resulting trend in on-current is illustrated in FIG. 12B. FIG. 12B is a graph illustrating the on-current for an in-line TFET geometry based on GaN/InN/graded-InGaN/GaN heterojunction. In the example illustrated in FIG. 12B, the thickness of the graded-InGaN is 0.6 nm and the thickness of InN ($t_{InN}$) varies from 0.8-2 nm. In the example illustrated in FIG. 12B, over the 0-2 nm range of InN layer thicknesses, the heterojunction develops from staggered-gap alignment towards a broken-gap alignment with increasing tInN, resulting in an appreciable increase in output current. However, as illustrated in FIG. 12B, as the InN layer thickness increases beyond 1.7 nm, the tunneling current density decreases due to the longer tunneling distance. This characteristic trade-off between tunneling distance and band offset gives an on-current.

It should be noted to evaluate group III-nitride TFET device energy efficiency for logic applications, one of the most important figures of merit is energy delay product (EDP). EDP may be defined as the product of intrinsic switching energy (often approximated as $C_g V^2_{dd}$ and switching delay ($C_g V_{dd}/I_{on}$) where $V_{dd}$, $C_g$, and $I_{on}$ are supply voltage, gate capacitance, and on-current respectively. Since the gate-source and gate-drain capacitances in TFETs vary significantly with bias, the capacitive formulations can be replaced with equivalent charge-based definitions for the energy ($Q_g V_{dd}$) and delay ($Q_g/I_{on}$), where $Q_g$ is the total gate charge required to switch the device state. The EDP, which is then $Q_g^2 V/I_{on}$, can be directly calculated from the charge distributions in simulations.

For the in-line GaN/InN/graded-InGaN/GaN TFET whose characteristics are shown in FIGS. 9A-9B, an EDP of 66.8 aJ-ps/μm at a supply voltage of 0.2 V is obtained from the TCAD results. These results compare favorably with incumbent CMOS devices, with EDPs well below that of either low power 15 nm node CMOS (4860 aJ-ps/μm) at a supply voltage of 0.3 V or high-performance 15 nm node CMOS (77.6 aJ-ps/μm) at a supply voltage of 0.73 V. The NEGF-based simulations are even more favorable, with approximately 2.5 times lower EDP 26.3 aJ-ps/μm due to the larger on-current (the gate charge exhibits only minor differences between NEGF and TCAD simulations).

The example TFETs described herein may be expected to achieve on-currents on the order of 200 µA/µm at supply voltages of 0.5 V and below, while also achieving switching slopes below 20 mV/decade. They also show a low energy delay product on the order of 26 aJ-ps/µm, which makes them promising as energy-efficient switches.

Various examples have been described. These and other examples are within the scope of the following claims.

What is claimed is:

1. A tunnel field-effect transistor comprising:
   a source-layer including p-type GaN;
   a drain-layer including n-type GaN; and
   an interlayer interfaced between the source-layer and the drain-layer, wherein the interlayer includes an InN layer, wherein the tunnel field-effect transistor further includes a gate, wherein the source-layer, the drain-layer, the interlayer and the gate are arranged in an in-line configuration; and
   wherein a thickness of the interlayer is based on a width of the gate, wherein the thickness of the interlayer is based on a relationship between energy band and tunneling distance that an interlayer thickness of 1.7 nanometers for a gate width of 20 nanometers provides for maximum on-current density.

2. The tunnel field-effect transistor of claim 1, wherein the thickness of the interlayer is within a range of 0.1 to 3.0 nanometers.

3. A tunnel field-effect transistor comprising:
   a source-layer including p-type GaN;
   a drain-layer including n-type GaN; and
   an interlayer interfaced between the source-layer and the drain-layer, wherein the interlayer includes an InN layer and a graded InGaN layer, wherein the tunnel field-effect transistor further includes a gate, wherein the source-layer, the drain-layer, the interlayer and the gate are arranged in an in-line configuration; and
   wherein a thickness of the interlayer is based on a width of the gate, wherein the thickness of the interlayer is based on a relationship between energy band and tunneling distance that an interlayer thickness of 1.7 nanometers for a gate width of 20 nanometers provides for maximum on-current density.

4. The tunnel field-effect transistor of claim 3, wherein the InGaN layer is linearly graded about its thickness.

5. The tunnel field-effect transistor of claim 4, wherein the InGaN layer is linearly graded about its thickness as follows: x is linearly increases from 0 to 1 for $In_xGa_{1-x}N$.

6. The tunnel field-effect transistor of claim 5, wherein the thickness of the graded InGaN layer is based on a thickness of the InN layer, wherein the thickness of the graded InGaN layer is based on an observed relationship that a graded InGaN layer thickness of 0.6 nanometers provides for maximum on-current density.

7. A tunnel field-effect transistor comprising:
   a source-layer including p-type GaN;
   a drain-layer including n-type GaN; and
   an interlayer interfaced between the source-layer and the drain-layer, wherein the interlayer includes an InGaN layer and a graded InGaN layer,
   wherein the tunnel field-effect transistor further includes a gate, wherein the source-layer, the drain-layer, the interlayer and the gate are arranged in an in-line configuration; and wherein a thickness of the interlayer is based on a width of the gate, wherein the thickness of the interlayer is based on a relationship between energy band and tunneling distance that an interlayer thickness of 1.7 nanometers for a gate width of 20 nanometers provides for maximum on-current density.

8. The tunnel field-effect transistor of claim 7, wherein a In mole faction of the InGaN layer is selected based on tunnel field-effect transistor achieving a switching slope of less than 60 millivolts per decade.

* * * * *